(12) United States Patent
Satoh et al.

(10) Patent No.: US 8,691,654 B2
(45) Date of Patent: Apr. 8, 2014

(54) SEMICONDUCTOR DEVICE HAVING STRESSOR FILM AND METHOD OF MANUFACTURING SEMICONDUCTOR DEVICE

(75) Inventors: Shigeo Satoh, Yokohama (JP); Kaina Suzuki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 212 days.

(21) Appl. No.: 13/089,743

(22) Filed: Apr. 19, 2011

(65) Prior Publication Data
US 2012/0038004 A1 Feb. 16, 2012

(30) Foreign Application Priority Data

Aug. 11, 2010 (JP) .................................. 2010-180353

(51) Int. Cl.
*H01L 21/336* (2006.01)

(52) U.S. Cl.
USPC .... 438/296; 438/424; 257/384; 257/E27.062; 257/197

(58) Field of Classification Search
CPC ............. H01L 21/28123; H01L 21/76; H01L 21/7607; H01L 29/0603; H01L 29/7846; H01L 21/76229; H01L 29/7843
USPC ......................................................... 257/384
See application file for complete search history.

(56) References Cited

U.S. PATENT DOCUMENTS

2007/0108526 A1 5/2007 Kohyama
2009/0039442 A1* 2/2009 Han et al. ...................... 257/384

FOREIGN PATENT DOCUMENTS

JP 2006-344663 A 12/2006
JP 2007-158322 A 6/2007

* cited by examiner

*Primary Examiner* — Eva Yan Montalvo
(74) *Attorney, Agent, or Firm* — Westerman, Hattori, Daniels & Adrian, LLP

(57) ABSTRACT

A first insulating film is formed above a semiconductor substrate with a device isolation insulating film defining a device region, a gate electrode and source/drain region formed. The first insulating film is etched, leaving the first insulating film in a recess formed in an edge of the device isolation insulating film. A second insulating film applying a stress to the semiconductor substrate is formed after etching the first insulating film.

20 Claims, 32 Drawing Sheets

SEMICONDUCTOR DEVICE HAVING STRESSOR FILM AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2010-180353, filed on Aug. 11, 2010, the entire contents of which are incorporated herein by reference.

FIELD

The embodiments discussed herein are related to a semiconductor device and a method of manufacturing a semiconductor device, more specifically, a semiconductor device including a stressor film for applying stress to the channel region of the transistor, and a method of manufacturing the same.

BACKGROUND

As higher performance is required of semiconductor devices, studies are made to improve the characteristics of the MISFET. As means of improving the characteristics of the MISFET is known a technique of introducing lattice strain into silicon crystal to thereby improve the mobility of the carriers flowing in the crystal. Lattice strain is introduced into the silicon crystal of the channel region of the MISFET, whereby the mobility of the carriers flowing in the channel region is improved, and the drive performance of the MISFET can be improved.

As a method for introducing lattice strain into the channel region of the MISFET, the technique of forming a film for applying stress called a stressor film is formed, covering the top of the gate electrode. As the stressor film, silicon nitride-based insulating film, such as silicon nitride film, silicon oxynitride film, etc., are widely used. A stressor film having a suitable stress corresponding to a conductivity type, etc. of the MISFET is formed from the side surface to the top surface of the gate electrode, whereby a required lattice stress can be introduced into the channel region.

The following are examples of related: Japanese Laid-open Patent Publication No. 2006-344663 and Japanese Laid-open Patent Publication No. 2007-158322.

The inventors of the present application have found that often the MISFET has the effect of the stressor film impaired and has the On-state current decreased.

SUMMARY

According to one aspect of an embodiment, there is provided a method of manufacturing a semiconductor device including forming, in a semiconductor substrate, a device isolation insulating film defining a device region, forming a gate insulating film above the device region, forming a gate electrode above the gate insulating film, forming source/drain regions in the semiconductor substrate, forming a first insulating film above the semiconductor substrate with the gate electrode and the source/drain regions formed, etching the first insulating film, leaving the first insulating film in a recess formed in an edge of the device isolation insulating film, and forming, above the semiconductor substrate, a second insulating film applying a stress to the semiconductor substrate, after etching the first insulating film.

According to another aspect of an embodiment, there is provided a semiconductor device including a device isolation insulating film formed in a semiconductor substrate and defining a device region, a gate insulating film formed above the device region, a gate electrode formed above the gate insulating film, source/drain regions formed in the semiconductor substrate, a first insulating film buried in a recess formed in an edge of the device isolation insulating film, and a second insulating film formed from a top of the device isolation insulating film onto a top of the gate electrode and applying a stress to the semiconductor substrate.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A semiconductor device and a method of manufacturing a semiconductor device according to a first embodiment will be described with reference to FIGS. 1 to 16B.

Figure 1:
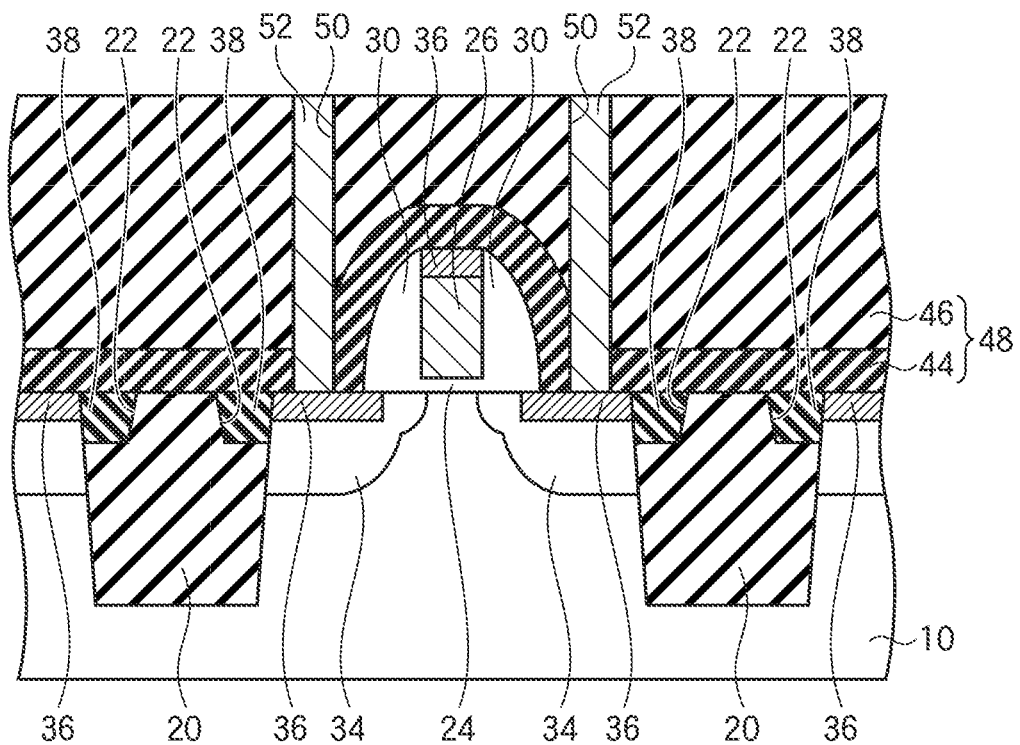
FIG. 1 is a diagrammatic sectional view illustrating a structure of a semiconductor device according to a first embodiment.
Figure 2:
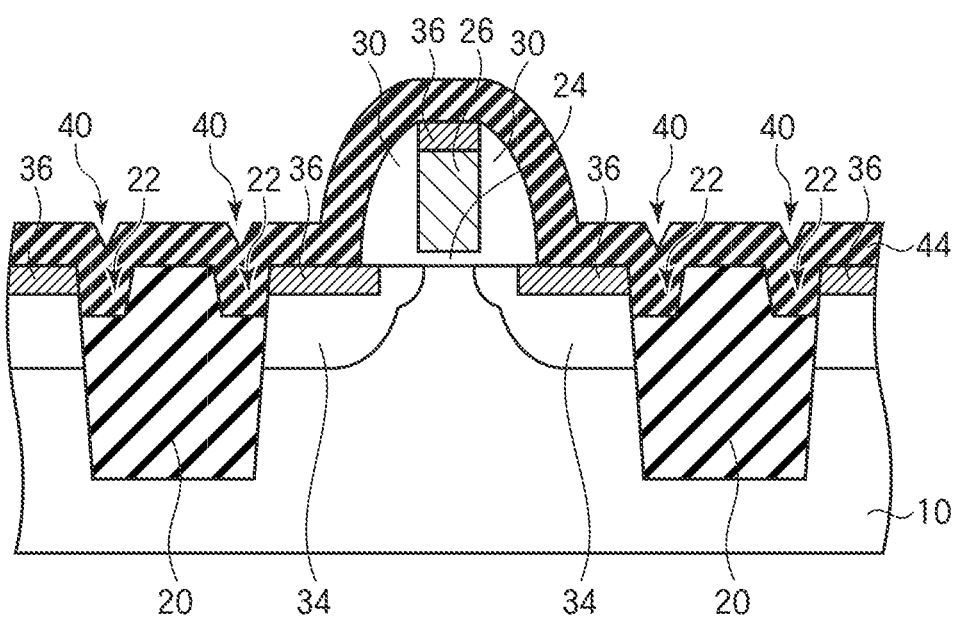
FIG. 2 is a diagrammatic sectional view illustrating a structure of a semiconductor device according to a reference embodiment of the first embodiment.
Figure 3:
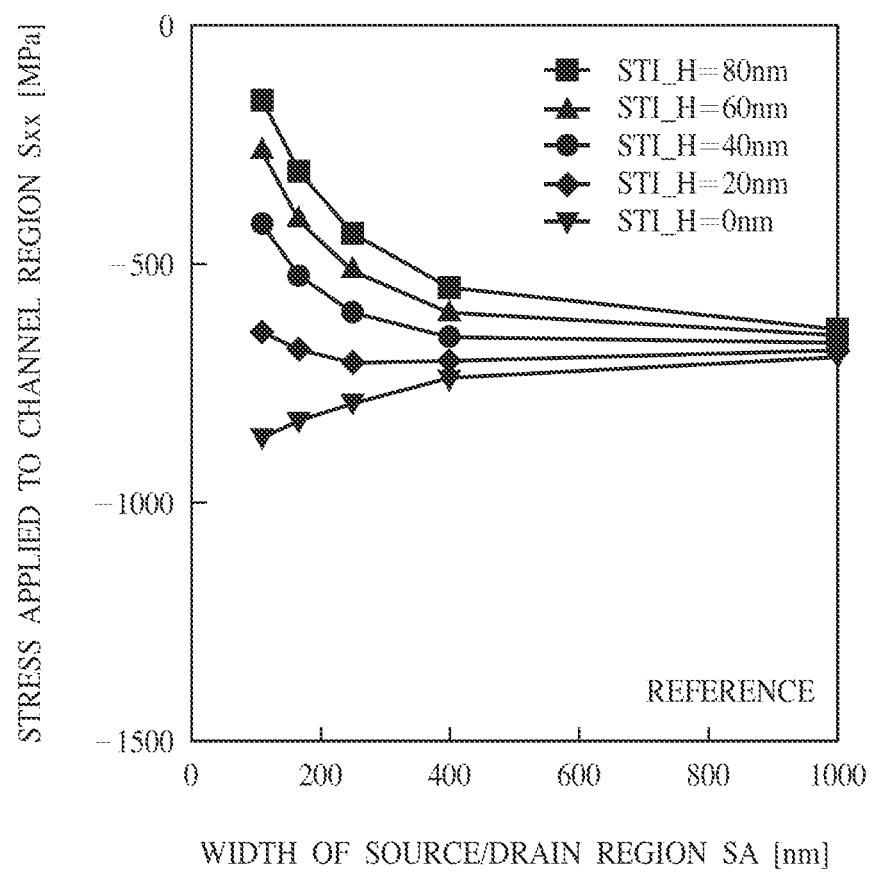
FIGS. 3, 6 and 7 are graphs illustrating a result of relationships between a stress value applied to a channel region of a p-channel MISFET and a width of a source/drain region in along a gate length direction given by simulation.
Figure 4:
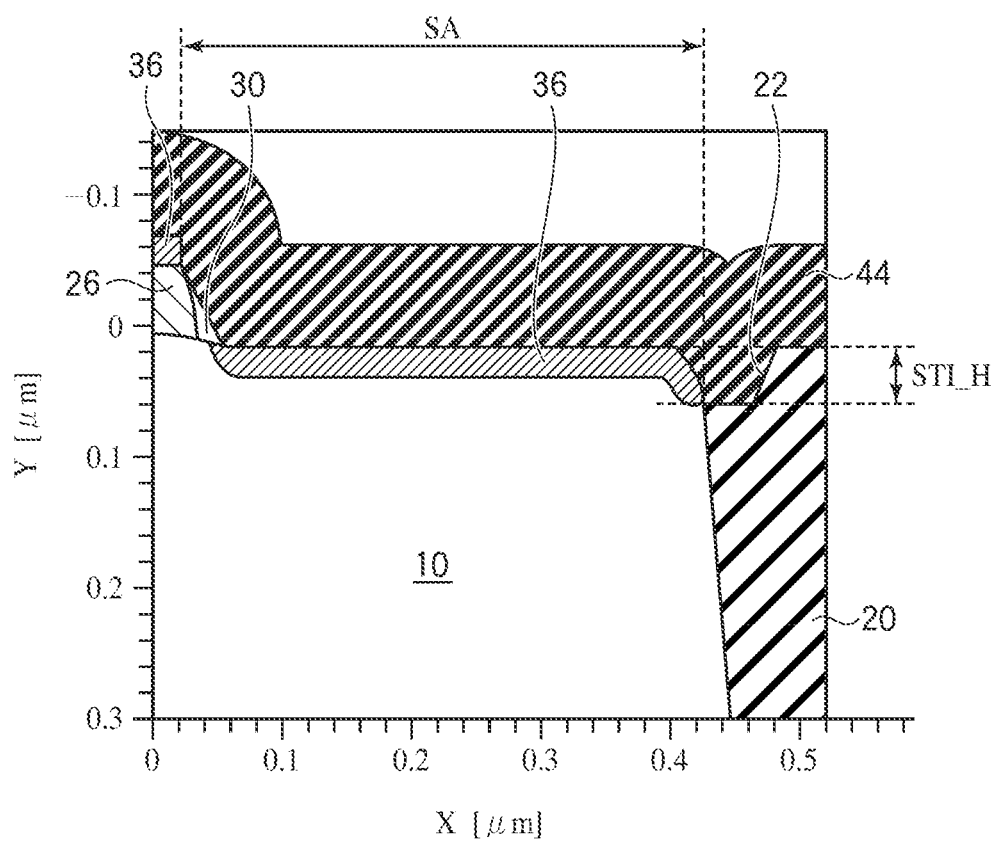
FIG. 4 is a view explaining the parameters used in the simulation of FIG. 3.
Figure 6:
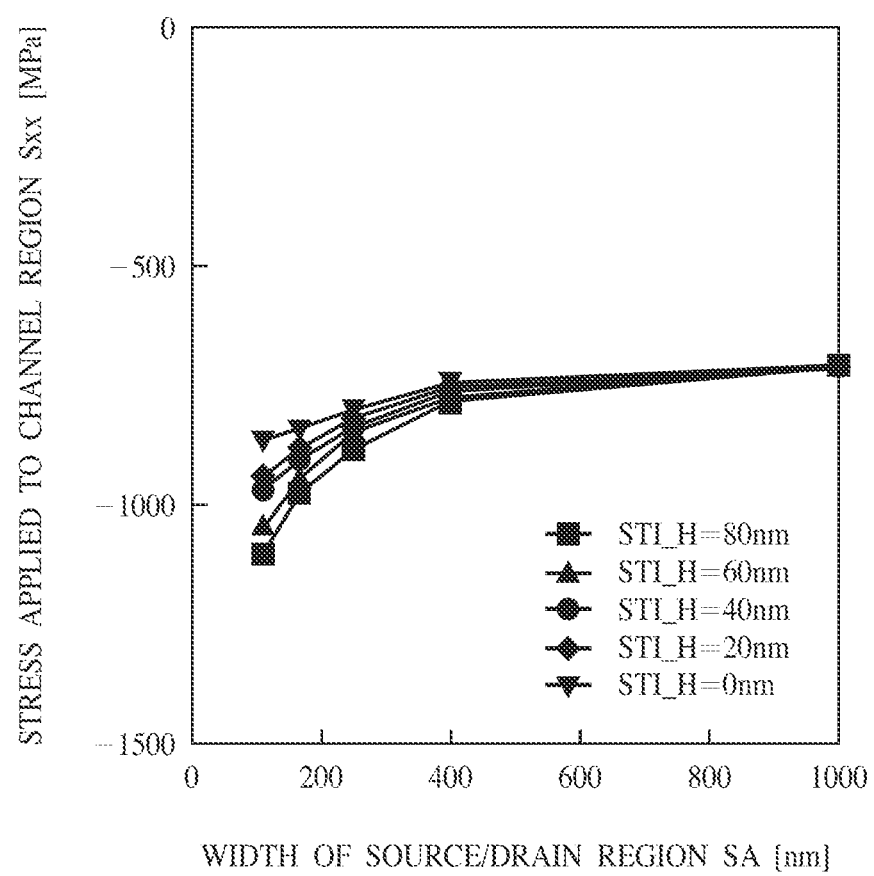
Figure 7:
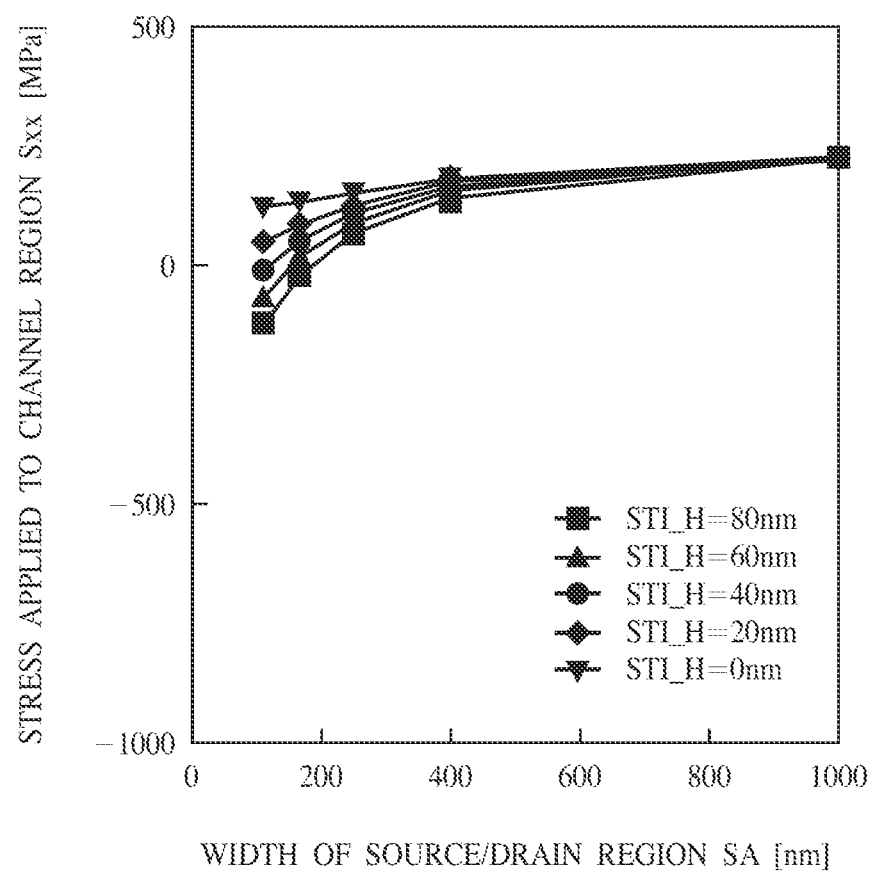
Figure 8A:
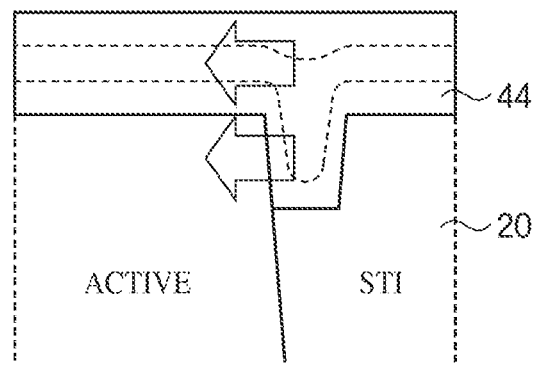
FIGS. 8A-8C are sectional views illustrating relationships between a configuration of a stressor film and applied stress.
Figure 8B:
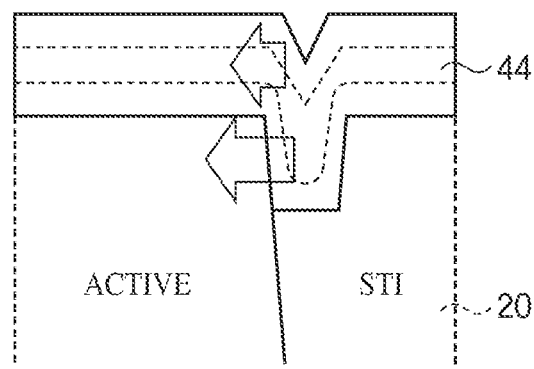
Figure 8C:
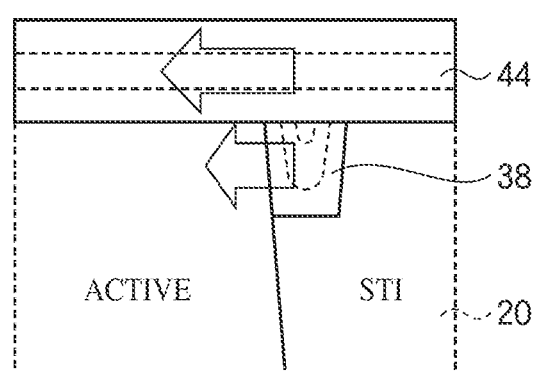
Figure 9:
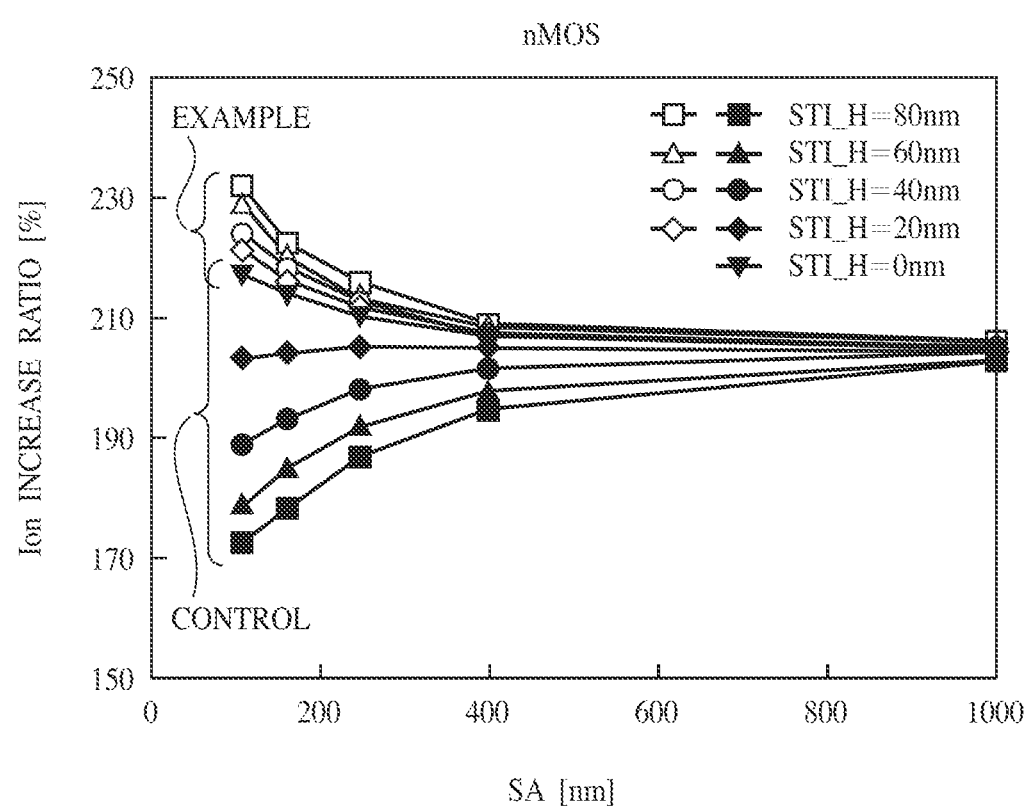
FIGS. 9 and 10 are graphs illustrating relationships between on-state current increase ratio and a width SA of the source/drain region.
Figure 10:
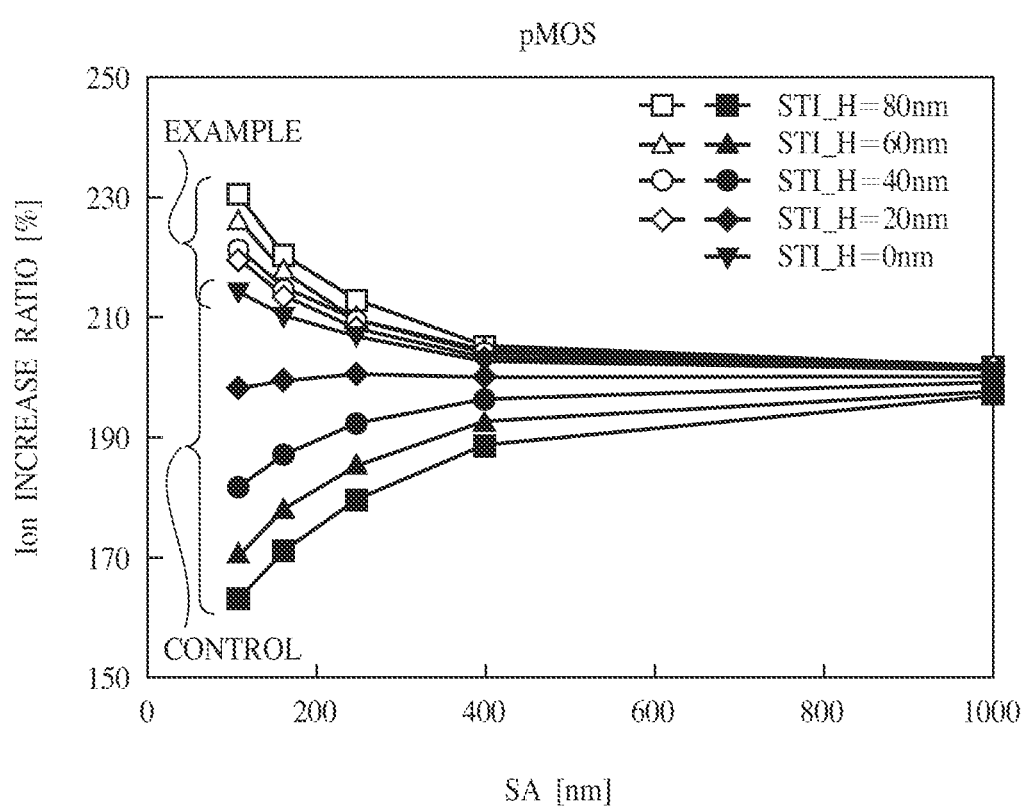

FIG. 1 is a diagrammatic sectional view illustrating a structure of the semiconductor device according to the present embodiment. FIG. 2 is a diagrammatic sectional view illustrating a structure of a semiconductor device according to a reference embodiment of the present embodiment. FIGS. 3, 6 and 7 are graphs illustrating a result of relationships between a stress value applied to a channel region of a p-channel MISFET and a width of a source/drain region in along a gate length direction given by simulation. FIG. 4 is a view explaining the parameters used in the simulation of FIG. 3. FIGS. 5A-5D are drawings illustrating a result of a stress value applied to a channel region of MISFET from a stressor film given by simulation. FIGS. 8A-8C are sectional views illustrating relationships between a configuration of a stressor film and applied stress. FIGS. 9 and 10 are graphs illustrating relationships between on-state current increase ratio and a width SA of the source/drain region. FIGS. 11A-16B are sectional views illustrating a method of manufacturing the semiconductor device according to the first embodiment.

First, the structure of the semiconductor device according to the present embodiment will be described with reference to FIG. 1.

In a silicon substrate 10, a device isolation insulating film 20 for defining device regions is formed. In border portions of the device isolation insulating film 20 with respect to the device regions, recesses 22 which are lower than a surface of the silicon substrate 10 in the device regions are formed. In the recesses 22, a silicon nitride film 38 is buried to planarize or mitigate the steps of the surface of the device isolation insulating film 20.

Above the device region of the silicon substrate 10 defined by the device isolation insulating film 20, a gate electrode 26 is formed with a gate insulating film 24 formed therebetween. In the silicon substrate 10 on both sides of the gate electrode 26, source/drain regions 34 are formed. Thus, MISFET including the gate electrode 26 and the source/drain regions 34 are formed.

On the side wall of the gate electrode 26, a sidewall spacer 30 is formed. On the gate electrode 26 and the source/drain regions 34, a metal silicide film 36 is formed.

Above the silicon substrate 10 with the device isolation insulating film 20 and the MISFET formed on, a silicon nitride film 44 having a required stress is formed. Above the silicon nitride film 44, a silicon oxide film 46 is formed. In the inter-layer insulating film 48 of the stacked structure of the silicon nitride film 44 and the silicon oxide film 46, contact plugs 52 connected to the metal silicide film 36 are buried.

As described above, in the semiconductor device according to the present embodiment, the silicon nitride film 38 is buried in the recess 22 formed in the border portion of the device isolation insulating film 20 with respect to the device region to thereby planarize or mitigate the step between the surface of the device region and the surface of the device isolation insulating film 20. The silicon nitride film 44, which is the stressor film for applying a prescribed lattice stress to the channel region of the MISFET is formed over the device region and the device isolation insulating film 20 having the step of the surface planarized or mitigated by the silicon nitride film 38. The semiconductor device according to the present embodiment has such the structure for the reason described below.

After the formation of the device isolation insulating film 20, the device isolation insulating film 20 is exposed to the various etching steps, such as the step of removing the sacrificial oxidation film before forming the gate insulating film 24, and resultantly the recess 22 is formed in the border portion between the device isolation insulating film 20 and the device region after the MISFETs have been formed. The recess 22 has a configuration depressed below the surface of the silicon substrate 10 in the device region. When the silicon nitride film 44, which is the stressor film, is deposited over the device isolation insulating film 20, the silicon nitride film 44 is buried in the recess 22. On the surface of the silicon nitride film 44, pits 40 reflecting the configuration of the recess 22 are formed (see FIG. 2).

The inventors of the present application have earnest studies of the stressor film of such configuration and found that the stress to be applied to the channel region of the MISFET is weakened.

FIG. 3 is a graph illustrating a result of relationships between a stress value horizontally applied to a center of a channel of a p-channel MISFET and a width of a source/drain region in along a gate length direction given by simulation. For the simulation of FIG. 3, the structure of the semiconductor device illustrated in FIG. 2 was used. As the stressor film (the silicon nitride film 44) covering the top of the gate electrode, silicon nitride film having compressive stress was used. In the graph, the minus values indicate compressive stresses. In FIG. 3, the width SA of the source/drain region is the distance from the end of the gate electrode 26 to the end of the device isolation insulating film 20, and STI_H indicates the depth of the recess 22 (see FIG. 4). In the graph, the plots marked by ▼ are for STI_H being 0 nm, the plots marked by ♦ are for the STI_H being 20 nm, the plots marked by ● are for the STI_H being 40 nm, the plots marked by ▲ are for the STI_H being 60 nm, and the plots marked by ■ are for the STI_H being 80 nm.

As shown in FIG. 3, when the width SA of the source/drain region is sufficiently large, stress value to be applied to the channel region do not much differ even when the depth of the recess 22 is varied.

On the other hand, when the depth STI_H of the recess 22 is larger than 0 nm, the absolute value of the stress value is smaller as the width SA becomes smaller. This means that as the width SA of the source/drain region is smaller, i.e., as the element is more downsized, the stress value of the stress to be applied to the channel region becomes smaller, and the mobility of the carriers flowing in the channel region is lowered, and the on-state current decreases. Such tendency becomes conspicuous as the depth STI_H of the recess 22 is larger. When the depth of the recess 22 is 0 nm, the absolute value of the stress value becomes larger as the depth STI_H becomes smaller, and this will be because as the channel region and the device isolation insulating film are nearer, the compressive stress of the device isolation insulating film 20 becomes increasingly influential.

Figure 5A:
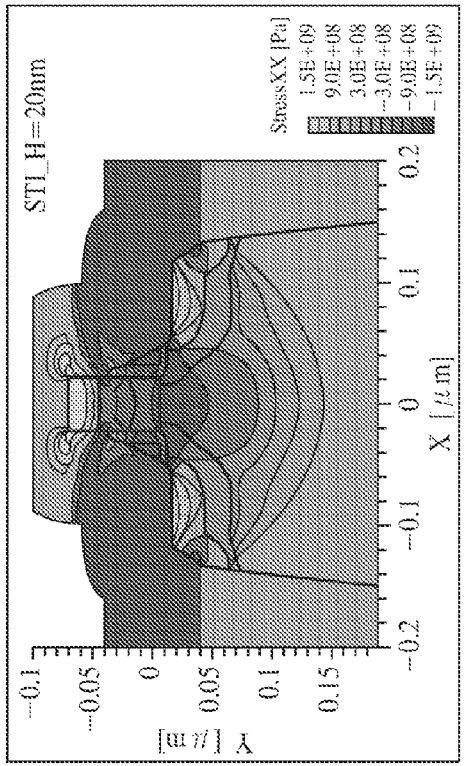
FIGS. 5A-5D are drawings illustrating a result of a stress value applied to a channel region of MISFET from a stressor film given by simulation.
Figure 5B:
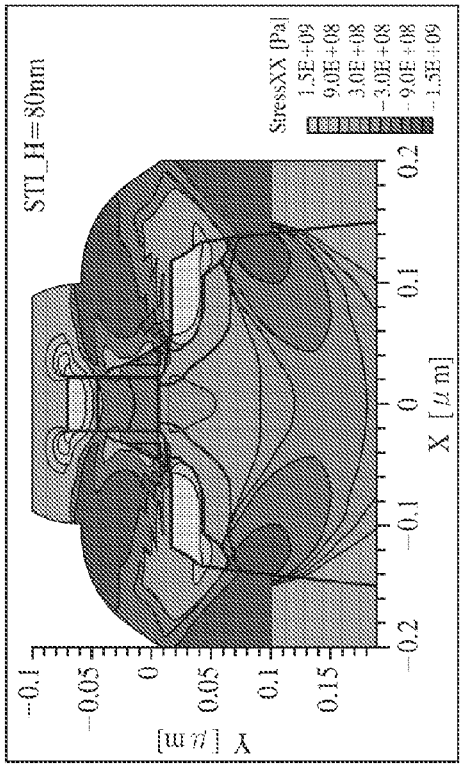
Figure 5C:
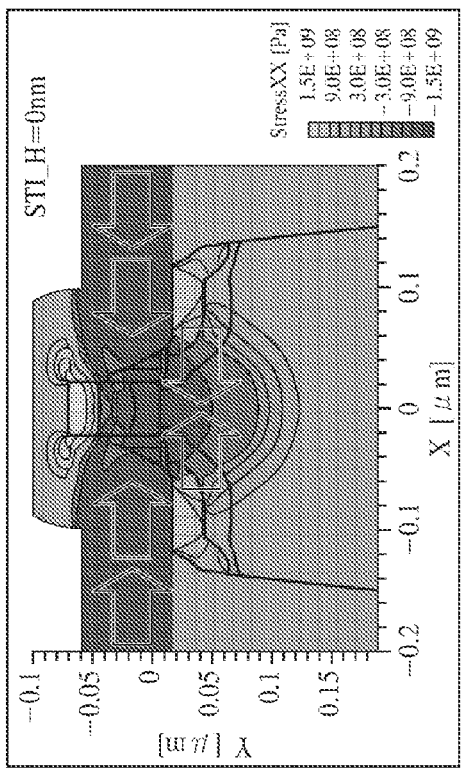
Figure 5D:
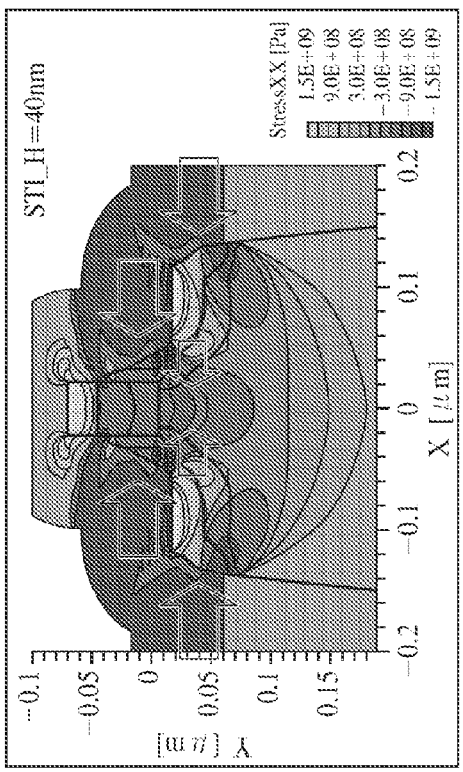

FIGS. 5A-5D are drawings illustrating results of a stress value applied to a channel region of MISFET from a stressor film given by simulation. FIG. 5A is of the case that the depth STI_H of the recess 22 is 0 nm, FIG. 5B is of the case that the depth STI_H of the recess 22 is 20 nm, FIG. 5C is of the case that the depth STI_H of the recess 22 is 40 nm, and FIG. 5D is of the case that the depth STI_H of the recess 22 is 80 nm.

As shown in FIG. 5, when the depth STI_H of the recess 22 is small, the stress from the stressor film is efficiently applied to the channel region. However, as the depth STI_H of the recess 22 becomes larger, the stress to be applied to the inside of the substrate from the parts near the bottom of the recess increase, and the stress to be applied to the channel region go on decreasing. It is seen that because of the recess 22 formed in the device isolation insulating film 20, stress cannot be efficiently applied from the stressor film to the channel region.

In view of such result, the inventors of the present application have obtained the idea that the step between the surface of the device region and the device isolation insulating film 20 is planarized or mitigated by burying an insulating film in the recess 22 and the stressor film is formed above the device region and the device isolation insulating film 20 which have been planarized or have had the step mitigated.

FIG. 6 is a graph illustrating a result of relationships between a stress value applied to a channel region of a p-channel MISFET and a width of a source/drain region in along a gate length direction given by simulation. For the simulation of FIG. 6, the structure of the semiconductor device according to the present embodiment illustrated in FIG. 1 was used. As the insulating film (the silicon nitride film 38) formed, filling in the recess 22 and the stressor film (the silicon nitride film 44) covering the top of the gate electrode, silicon nitride film having compressive stress was used. In the graph, the plots marked by ▼ are for STI_H being 0 nm, the plots marked by ◆ are for the STI_H being 20 nm, the plots marked by ● are for the STI_H being 40 nm, the plots marked by ▲ are for the STI_H being 60 nm, and the plots marked by ■ are for the STI_H being 80 nm.

As shown in FIG. 6, when the width SA of the source/drain region is sufficiently large, even when the depth of the recess 22 is varied, the stress value of the stress to be applied to the channel region does not largely differ.

On the other hand, the absolute value of the stress value gradually becomes large as the width SA of the source/drain region is smaller. That is, in the semiconductor device according to the present embodiment, as the width SA of the source/drain region is smaller, the stress value of stress to be applied to the channel region becomes larger, as do not in the semiconductor device illustrated in FIG. 2. This tendency becomes conspicuous as the depth STI_H of the recess 22 is larger.

FIG. 7 is a graph illustrating a result of such simulation of the case that an insulating film (the silicon nitride film 38) was formed, filling the recess 22, and no stressor film (the silicon nitride film 44) covering the top of the gate electrode was formed. As the insulating film (the silicon nitride film 38) filling the recess 22, silicon nitride film having compressive stress was used. In the graph, the plots marked by ▼ are for STI_H being 0 nm, the plots marked by ◆ are for the STI_H being 20 nm, the plots marked by ● are for the STI_H being 40 nm, the plots marked by ▲ are for the STI_H being 60 nm, and the plots marked by ■ are for the STI_H being 80 nm.

As shown in FIG. 7, also in the case that the silicon nitride film 38 filing the recess 22 is formed alone, the same tendency as shown in FIG. 6 can be obtained although the compressive stress value is small. The insulating film (the silicon nitride film 38) buried in the recess 22 may not be essentially film having stress, but the use of film having stress can further increase the stress value of stress to be applied to the channel region.

The inventors of the present application infer as follows the mechanism for the semiconductor device according to the present embodiment can efficiently apply stress to the channel region.

The film having stress goes on growing while mitigating its own stress (while applying the stress to the channel region). Accordingly, in the semiconductor device illustrated in FIG. 2, in the process of forming the silicon nitride film 44, the stress applied from the silicon nitride film 44 is divided into a stress to be parallelly applied to the film surface and a stress to be applied to the recess 22 and will not be efficiently applied to the channel region (see FIG. 8A). This will be more conspicuous when recess 40 is formed in the surface of the silicon nitride film 44 (FIG. 8B). As the recess is deeper, a larger ratio of the stress will be applied to the recess 22, and the stress to be applied to the channel region will be smaller.

In contrast to this, in the semiconductor device according to the present embodiment, because the silicon nitride film 38 and the silicon nitride film 44 are formed separately, the stress applied from the silicon nitride film 38 and the stress applied from the silicon nitride film 44 will be efficiently applied respectively to the channel region (see FIG. 8C). Even when the recess 22 is deep, the stress applied from the silicon nitride film 44 never changes, and conversely, the stress to be applied to the channel region will become larger as a whole by an increase of the stress from the silicon nitride film 38.

In the above description, it is assumed that a film having compressive stress is used as the stressor film for the p-channel MISFET. For n-channel MISFET, in place of the film having compressive stress, film having tensile stress is used to produce the same effect.

FIGS. 9 and 10 are graphs of the relationships between the on-state current ($I_{on}$) increase ratio and the width SA of the source/drain region. FIG. 9 is for re-channel MISFET, and FIG. 10 is for p-channel MISFET. The on-state current increase ratio $\Delta I_{dsn}$ of the n-channel MISFET and the on-state current increase ratio $\Delta I_{dsp}$ for the p-channel MISFET were computed by the following formulas. In these formulas, $\epsilon$ represents a distortion calculated from a stress value.

$$\Delta I_{dsn} = 5.2 \times 10^3 \Delta \epsilon x - 9.7 \times 10^3 \Delta \epsilon y + 2.2 \times 10^3 \Delta \epsilon z$$

$$\Delta I_{dsp} = 7.4 \times 10^3 \Delta \epsilon x + 8.2 \times 10^3 \Delta \epsilon y + 8.3 \times 10^3 \Delta \epsilon z$$

In the graphs, the plots marked by ▼ indicate the case the STI_H is 0 nm, the plots marked by ◇ and ◆ indicate the case that the STI_H is 20 nm, the plots indicated by ○ and ● indicate the case that the STI_H is 40 nm, and the plots indicated by △ and ▲ indicate the case that the STI_H is 60 nm, and the plots marked by □ and ■ indicate the case that the STI_H is 80 nm. The white plots are for the semiconductor device according to the present embodiment (example) and the black plots are for the semiconductor device illustrated in FIG. 2 (control).

As shown in FIGS. 9 and 10, in the semiconductor device according to the present embodiment, the on-state current could be increased in both of the n-channel MISFET and the p-channel MISFET.

Next, the method of manufacturing the semiconductor device according to the present embodiment will be described with reference to FIGS. 11A to 16B.

First, above the silicon substrate 10, a silicon nitride film 12 of, e.g., a 100 nm-thickness is formed by, e.g., CVD method. Between the silicon substrate 10 and the silicon nitride film 12, a silicon oxide film may be formed.

Then, by photolithography and wet etching, the silicon nitride film 12 is patterned to remove the silicon nitride film 12 in the region for the device isolation insulating film to be formed.

Figure 11A:
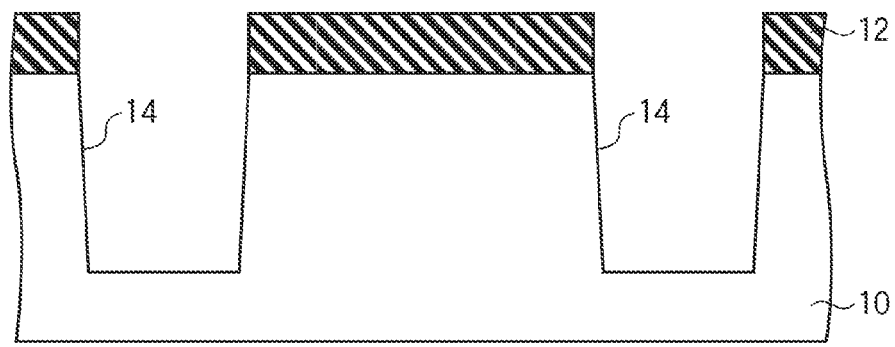
FIGS. 11A-11C, 12A-12C, 13A-13B, 14A, 15A-15B and 16A-16B are sectional views illustrating a method of manufacturing the semiconductor device according to the first embodiment.

Then, with the silicon nitride film 12 as the mask, the silicon substrate 10 is anisotropically etched to form a device isolation trench 14 of, e.g., a 300 m-depth in the silicon substrate 10 (FIG. 11A).

Then, the silicon substrate 10 is thermally oxidized by thermal oxidation method to form a silicon oxide film 16 of, e.g., a 10 nm-thickness on the inside wall of the device isolation trench 14.

Next, above the entire surface, a silicon oxide film 18 of, e.g., a 500 nm-thickness is deposited by, e.g., CVD method.

Figure 11B:
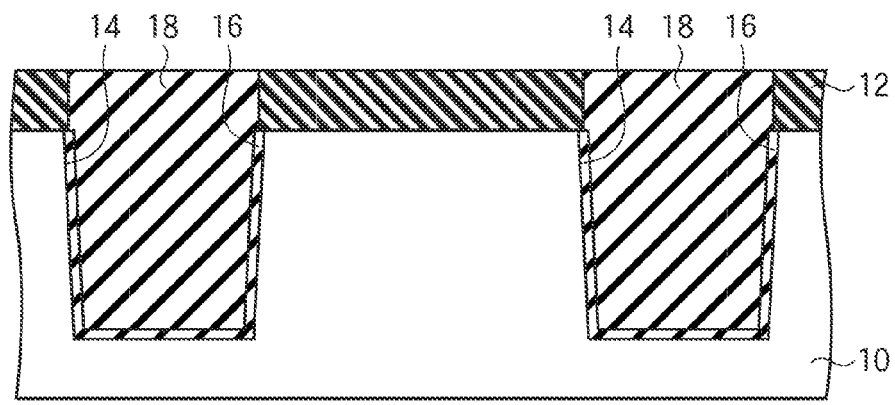

Then, the silicon oxide film 18 is polished by, e.g., CMP (Chemical Mechanical Polishing) method with the silicon nitride film 12 as the stopper to removed the silicon oxide film 18 above the silicon nitride film (FIG. 11B).

Next, the silicon nitride film 12 is removed by, e.g., wet etching using boiled phosphoric acid.

Figure 11C:
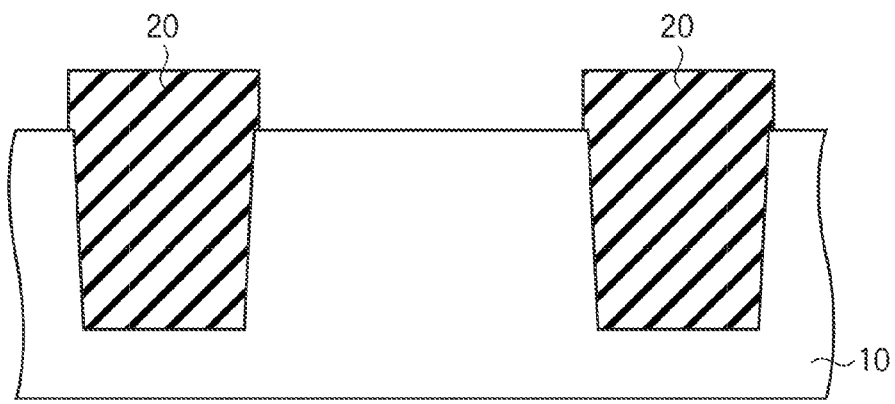

Thus, the device isolation insulating film 20 is formed by the silicon oxide films 16, 18 buried in the device isolation trench 14 (FIG. 11C).

Next, the surface of the silicon substrate 10 is thermally oxidized by thermal oxidation method to form a sacrificial film (not illustrated) of a silicon oxide film to be a protection film in ion implantation, etc.

Next, in the respective device regions, by photolithography and ion implantation, corresponding to the types of the MISFETs, required impurities for forming wells and the threshold voltage control are implanted.

Figure 12A:
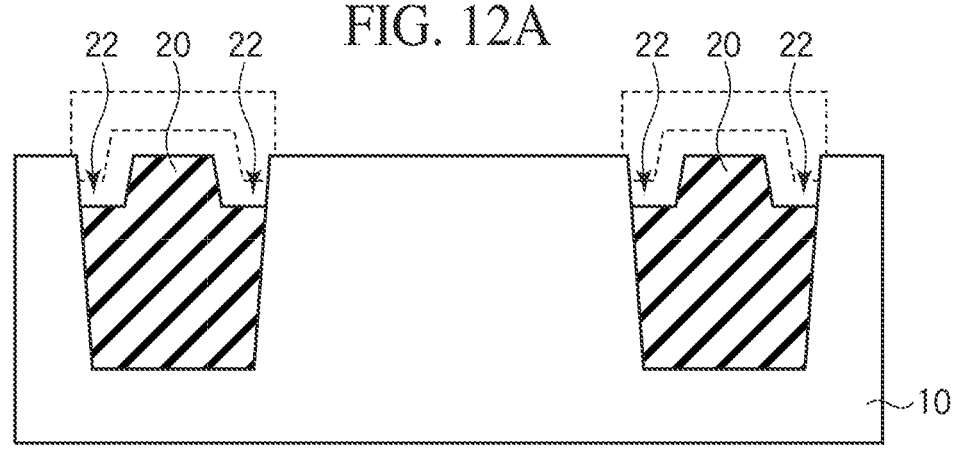

Next, e.g., wet etching using a fluoric acid aqueous solution, the sacrificial film of silicon oxide film formed on the device regions is removed. In this etching, the device isolation insulating film 20 is also isotropically etched from the surface side (see the dotted lines in FIG. 12A), and recesses (divots) 22 of, e.g., an about 60 nm-depth from the surface of the device region are formed in the borders between the device regions and the device isolation insulating film 20 (FIG. 12A).

Next, the surface of the silicon substrate 20 is thermally oxidized by thermal oxidation method to form a gate insulating film 24 of a silicon oxide film.

Then, above the entire surface, a conductive film to be the gate electrode, e.g., polycrystalline silicon film is deposited by, e.g., CVD method.

Next, the polycrystalline silicon film is patterned to form the gate electrode 26 of the polycrystalline silicon film.

Figure 12B:
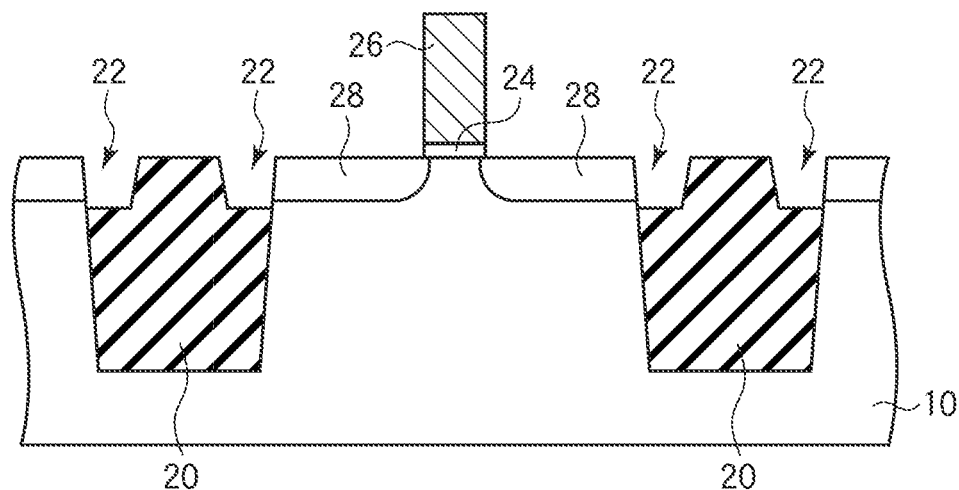

Then, ion implantation is made with the gate electrode 26 as the mask to form impurity diffused regions 28 to be the extension regions in the silicon substrate on both sides of the gate electrode 26 (FIG. 12B).

Next, above the entire surface, a silicon oxide film is deposited by, e.g., CVD method.

Next, the silicon oxide film is etched back to form the sidewall spacers 30 on the side walls of the gate electrode 26.

Figure 12C:
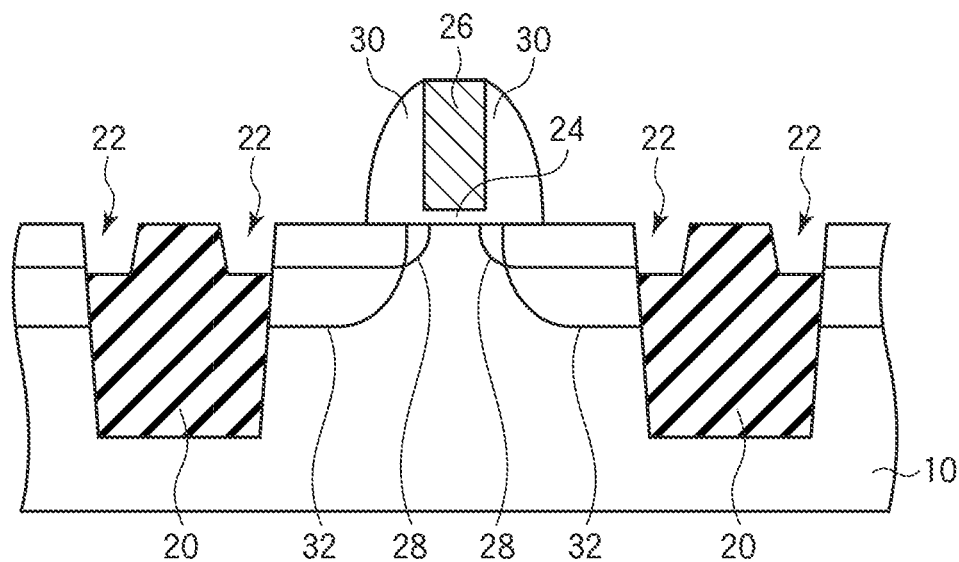

Next, ion implantation is made with the gate electrode 26 and the sidewall spacers 30 as the mask to form impurity diffused regions 32 to be the sources/drain regions in the silicon substrate 10 on both sides of the gate electrode 26 (FIG. 12C).

Then, thermal processing is made in nitrogen atmosphere to activate the impurities in the impurity diffused regions 28, 32 and form the source/drain regions 34.

Figure 13A:
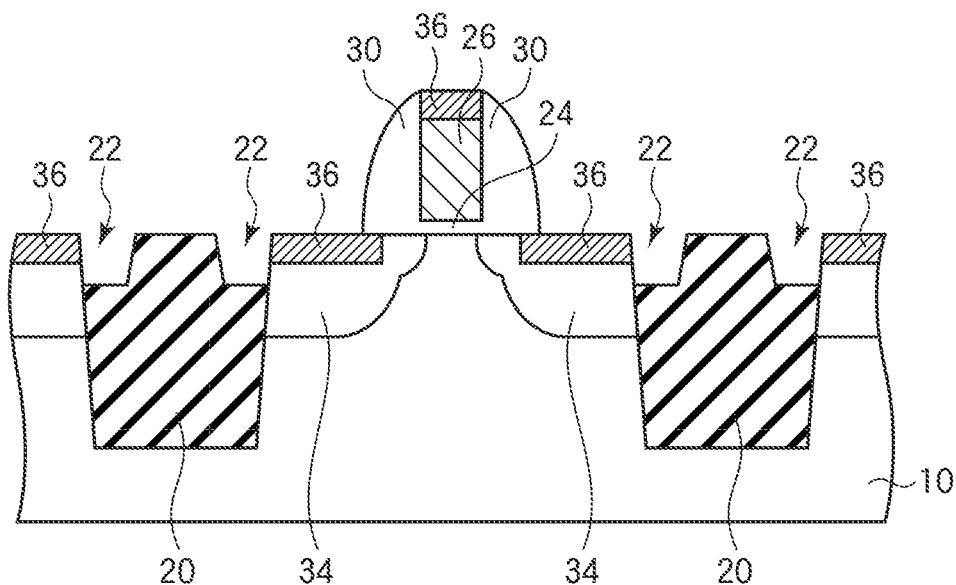

Then, by salicide (self-aligned silicide) process, the metal silicide film 36 is formed selectively on the surfaces sides of the gate electrode 26 and the source/drain regions 34 (FIG. 13A).

Figure 13B:
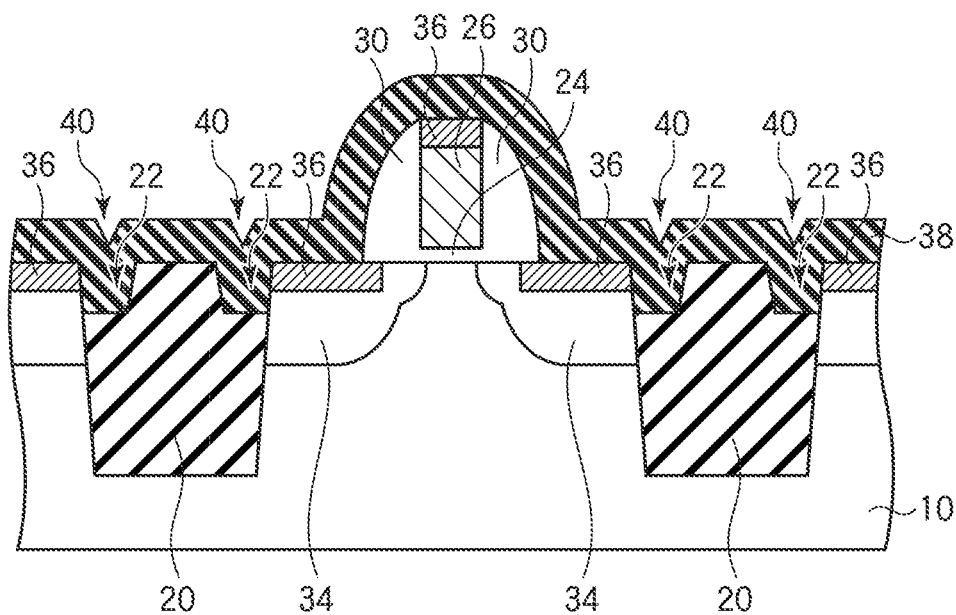

Then, above the entire surface, the silicon nitride film 38 of, e.g., an 80 nm-thickness is deposited by, e.g., CVD method. Thus, recesses 22 are buried by the silicon nitride film 38. In the surface of the silicon nitride film 38, recesses 40 are formed, reflecting configurations of the recesses 22 (FIG. 13B).

The silicon nitride film 38 is preferably a film having stress but may not be essentially a film having stress.

The first object of the silicon nitride film 38 is to fill the recesses 22 to planarize or mitigate the steps of the surface, and for the first purpose, the silicon nitride film 38 may not be essentially a film having stress. The film 38 may not be essentially the silicon nitride film, and may be formed of other insulating film, e.g., a silicon oxide film, etc.

However, the use of a film having stress as the silicon nitride film 38 produces the effect of increasing lattice stress to be applied to the channel region. When a film having stress is formed, it is preferable to use a film having compressive stress for the p-channel MISFET and a film having tensile stress for the n-channel MISFET.

Then, the silicon nitride film 38 is left selectively in the recesses 22 to planarize or mitigate the steps of the recesses 22.

The silicon nitride film 38 is anisotropically etched in the same way as in forming the sidewall spacers 30, whereby the silicon nitride film 38 can be left in the recesses 22. However, by this processing, the silicon nitride film 38 is often left on the side walls of the sidewall spacers 30. Then, in the present embodiment, the silicon nitride film 38 formed on the sidewall spacers 30 is removed in advance.

Figure 14A:
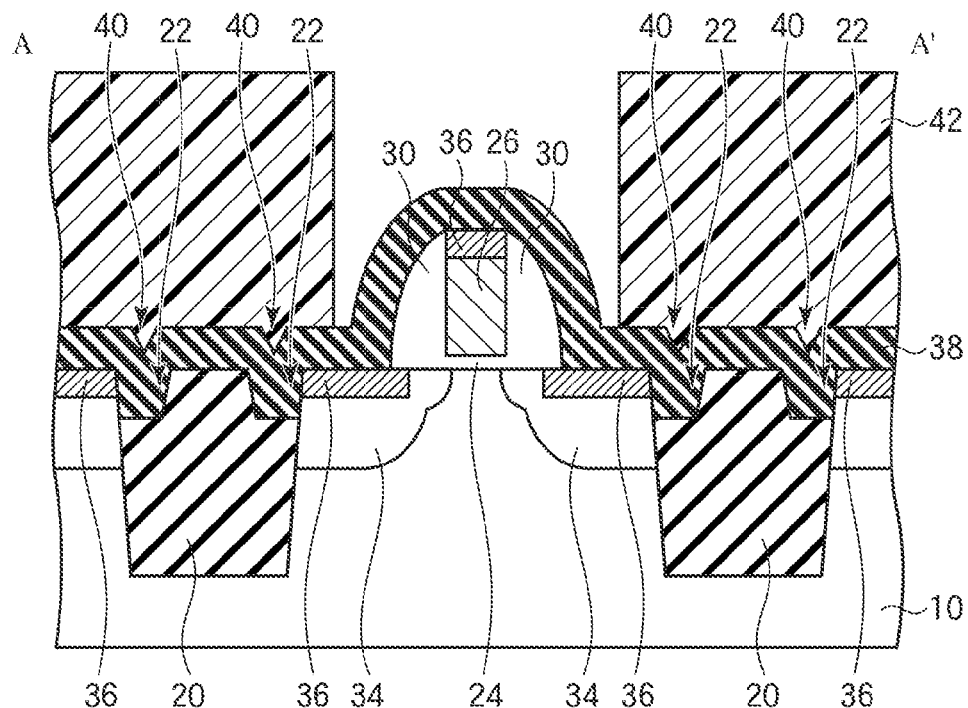
Figure 14B:
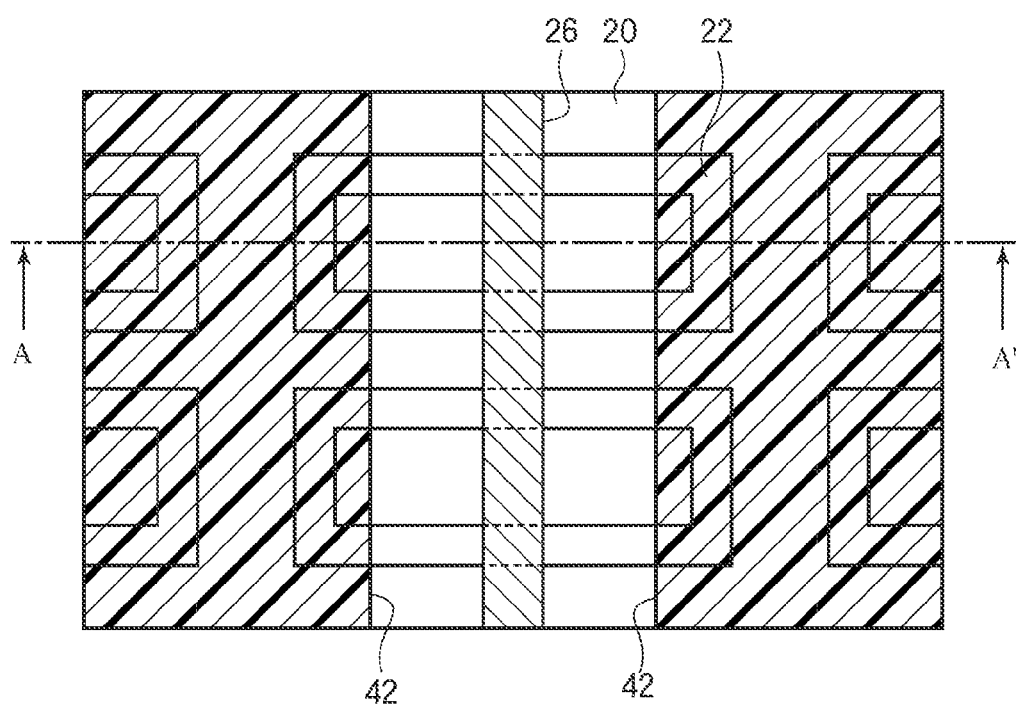
FIG. 14B is a plan view illustrating a method of manufacturing the semiconductor device according to the first embodiment.

First, by photolithography, a photoresist film 42 exposing the region where the gate electrode 26 and the sidewall spacers 30 have been formed is formed (FIGS. 14A and 14B).

Then, the silicon nitride film 38 is etched with the photoresist film 42 as the mask to remove the silicon nitride film 38 on the gate electrode 26 and the sidewall spacers 30.

The silicon nitride film 38 is etched, e.g., with a mixed gas, e.g., $CHF_3/Ar/O_2$ as the etching gas and in an etching quantity equivalent to a film thickness of the film deposited on the plane substrate and over-etching of 10%-30% of the film thickness. Thus, the silicon nitride film 38 formed on the sidewall spacers 30 and the gate electrode 26 can be removed without residues.

Figure 15A:
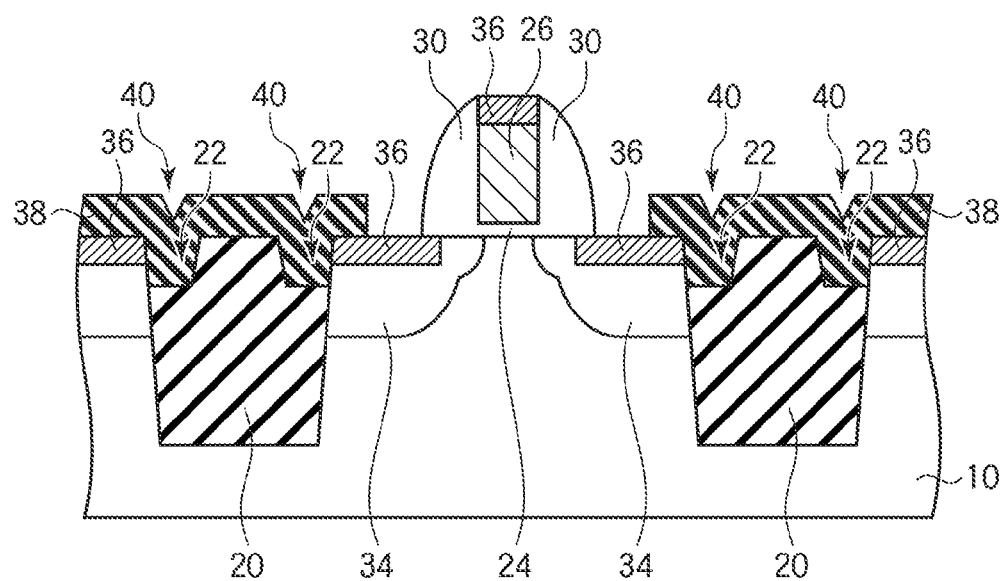

Then, the photoresist film 42 is removed by, e.g., asking method (FIG. 15A).

Figure 15B:
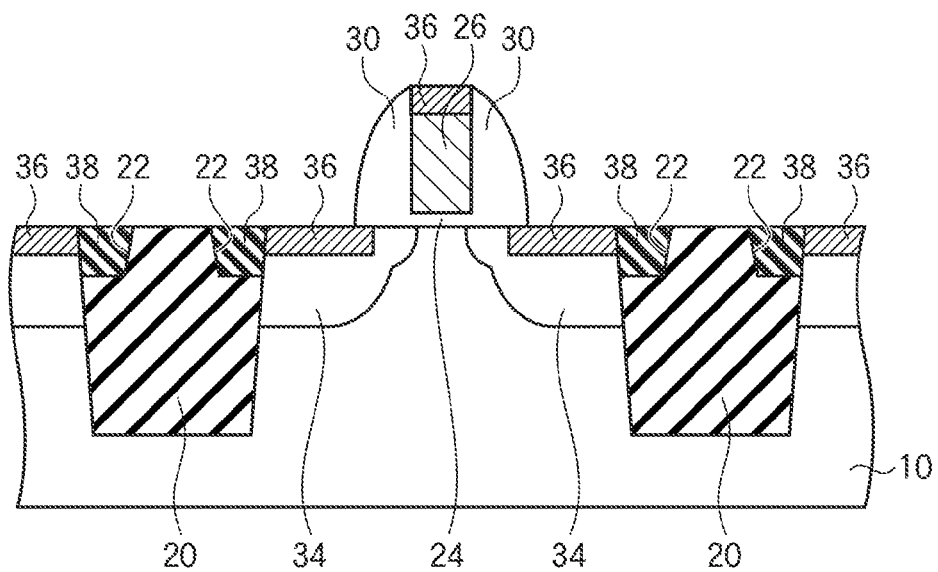

Next, the silicon nitride film 38 is anisotropically etched (etched back) to be left selectively in the recesses 22 and planarize or mitigate the steps of the recesses 22 (FIG. 15B).

The silicon nitride film 38 is etched with a mixed gas of, e.g., $CHF_3/Ar/O_2$ as the etching gas and in an etching quantity equivalent to the film thickness of the film deposited on the plane substrate and over-etching of about 0%-5% of the film thickness. Thus, the silicon nitride film in the reset region can be removed, leaving the silicon nitride film 38 in the recesses 22.

The step of burying the silicon nitride film 38 in the recesses 22 is carried out preferably after the salicide process for forming the metal silicide film 26, as in the present embodiment.

In the salicide process, an etching step of removing the silicon oxide film of the native oxide film, etc. formed on the surface of the silicon substrate 10 is made as the pretreatment. Due to the volumetric change accompanying the salicide reaction, the surface of the metal silicide film 36 formed on the source/drain regions is higher than the original surface of the silicon substrate.

Accordingly, the salicide process is made after the silicon nitride film 38 has been buried in the recesses 22, whereby new steps are formed between the device regions and the device isolation region, and the steps act to weaken stress to be applied to the channel region, as do the recesses 22.

The salicide process is made in advance, whereby the steps of the recesses 22 containing the steps generated by the salicide process can be mitigated by the silicon nitride film 38 buried in the recesses 22.

Figure 16A:
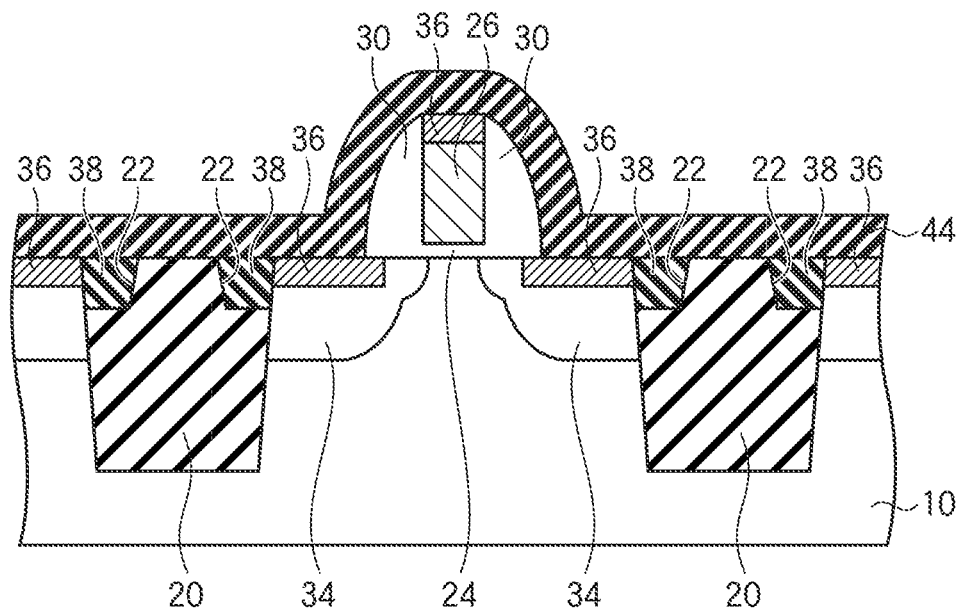

Next, above the entire surface, a silicon nitride film 44 of, e.g., an 80 nm-thickness and having a prescribed stress is formed by, e.g., CVD method (FIG. 16A). As the silicon nitride film 44 covering the p-channel MISFET, a stressor film having, e.g., a 1 GPa-3 GPa compressive stress is formed. As the silicon nitride film 44 covering the n-channel MISFET, a stressor film having, e.g., a 1 GPa-2 GPa tensile stress is formed.

The silicon nitride film having the tensile stress can be formed, e.g., by thermal CVD method, at a 5 sccm-50 sccm flow rate of, e.g., dichrolosilane ($SiCl_2H_2$), silane ($SiH_4$) or disilane ($Si_2H_6$) as the source gas for silicon, a 500 sccm-10000 sccm flow rate of $NH_3$ as the source gas for nitrogen, a 500 sccm-10000 sccm flow rate of $N_2$ or Ar and under the conditions of a 0.1 Torr-400 Torr pressure and a temperature of 500° C.-700° C.

The silicon nitride film having the compressive stress can be formed, e.g., by plasma CVD method, at a 100 sccm-1000 sccm flow rate of, e.g., silane ($SiH_4$) as the source gas for silicon, a 500 sccm-10000 sccm flow rate of $NH_3$ as the source gas of nitrogen and a 500 sccm-10000 sccm flow rate of $N_2$ or Ar and under the conditions of a 0.1 Torr-400 Torr, a temperature of 500° C.-700° C. and a 100 W-1000 W RF power.

To efficiently apply stress to the channel region from the silicon nitride film 44, preferably, the silicon nitride film 44 is formed from the side walls of the gate electrode 26 to the top surface of the gate electrode 26 so as to cover the gate electrode 26.

Next, above the entire surface, a silicon oxide film 46 of, e.g., a 300 nm-thickness is deposited by, e.g., CVD method.

Next, the surface of the silicon oxide film 46 is planarized by, e.g., CMP method to form the inter-layer insulating film 48 including the silicon nitride film 44 and the silicon oxide film 46 and having the surface planarized.

Next, by photolithography and dry etching, the contact holes 50 down to the metal silicide film 36 are formed in the inter-layer insulating film 48.

Figure 16B:
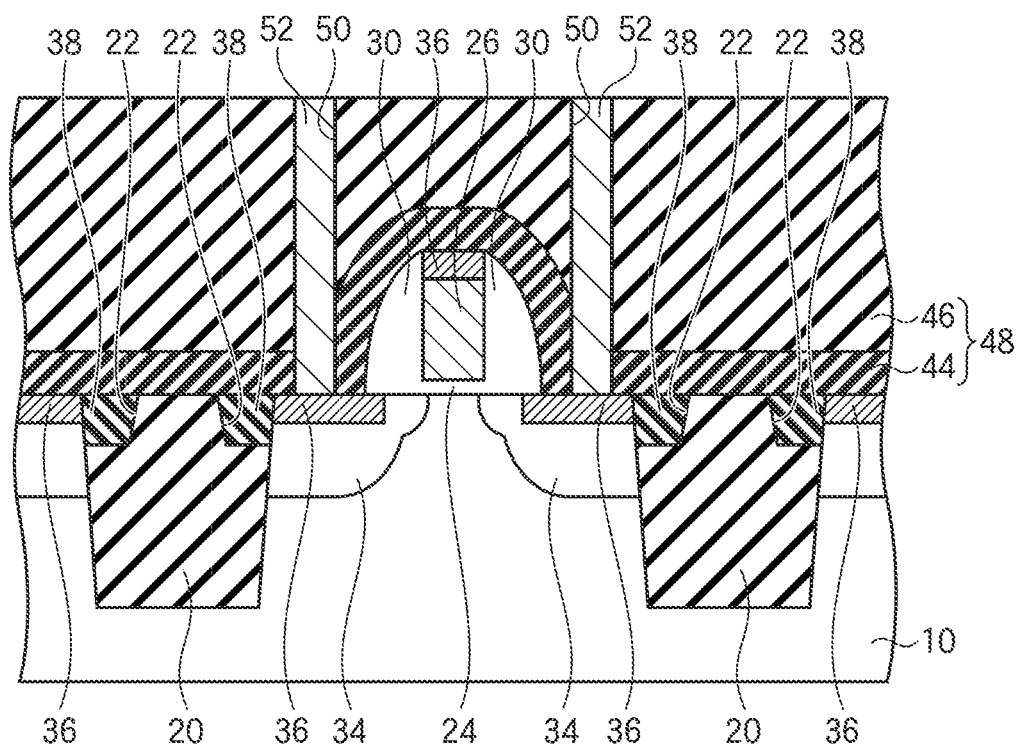

Then, a barrier metal and a tungsten film are deposited, and then these conductive films above the inter-layer insulating film 48 are etched back to form the contact plugs 52 buried in the contact holes 50 (FIG. 16B).

Then, as required, interconnections connected to the contact plugs 52, etc. are formed, and the semiconductor device according to the present embodiment is completed.

As described above, according to the present embodiment, the insulating film is buried in the recesses of the device isolation insulating film with respect to the device regions to thereby planarize or mitigate the steps between the surface of the device region and the surface of the device isolation insulating film, the stressor film which applies required lattice stress to the channel region of the MISFET thereon, whereby even when the elements are downsized, the stress from the stressor film can be efficiently applied to the channel region. Thus, the current drive performance of the MISFET can be improved.

A Second Embodiment

A semiconductor device and a method of manufacturing the same according to a second embodiment will be described with reference to FIGS. 17 to 19B. The same members of the present embodiment as those of the semiconductor device and the method of manufacturing the same according to the first embodiment illustrated in FIGS. 1 to 16B are represented by the same reference numbers not to repeat or to simplify their explanation.

Figure 17:
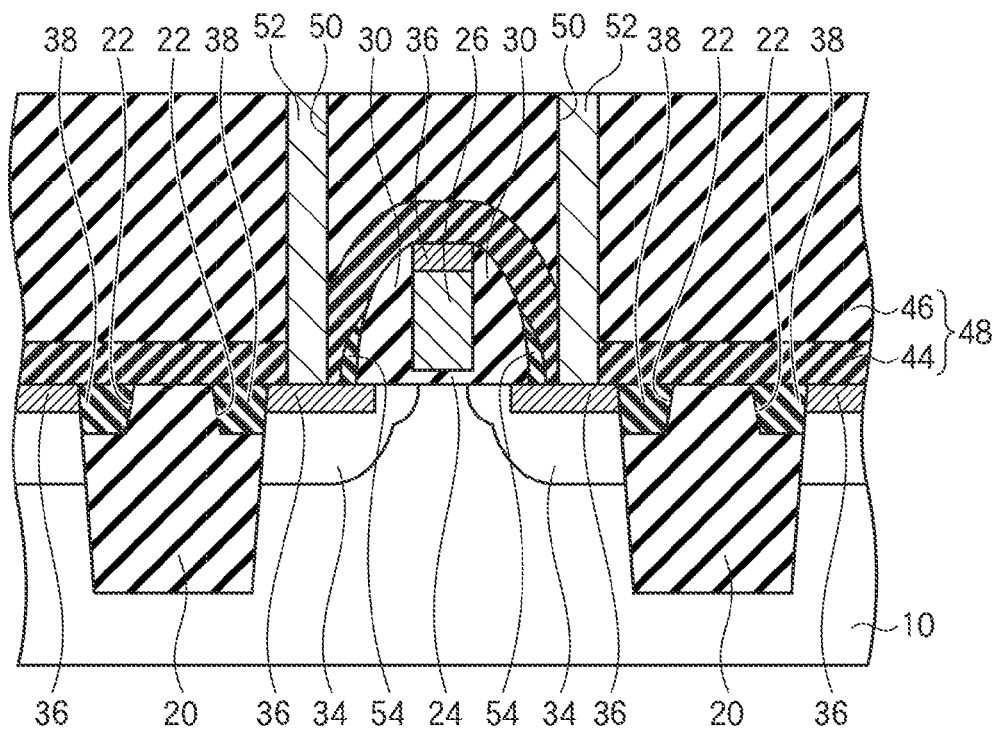
FIG. 17 is a diagrammatic sectional view illustrating a structure of a semiconductor device according to a second embodiment.

FIG. 17 is a diagrammatic sectional view illustrating a structure of the semiconductor device according to the present embodiment. FIGS. 18A-19B are sectional views illustrating the method of manufacturing the semiconductor device according to the present embodiment.

First, the structure of the semiconductor device according to the present embodiment will be described with reference to FIG. 17.

As illustrated in FIG. 17, the semiconductor device according to the present embodiment is the same as the semiconductor device according to the first embodiment illustrated in FIG. 1 except that in the former, the sidewall spacers 54 are formed on the side walls of the sidewall spacers 30. The sidewall spacers 54 are residues of the silicon nitride film 38 buried in the recesses 22.

Next, the method of manufacturing the semiconductor device according to the present embodiment will be described with reference to FIGS. 18A to 19B.

First, in the same way as in the method of manufacturing the semiconductor device according to the first embodiment illustrated in FIGS. 11A to 13A, the device isolation insulating film 20 and the MISFET are formed on the silicon substrate 10.

Figure 18A:
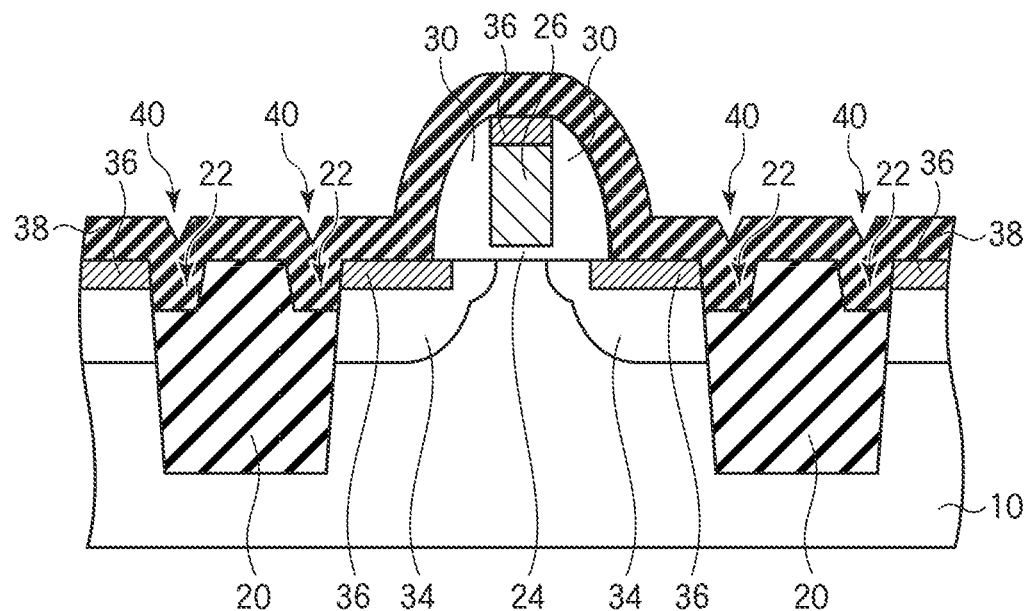
FIGS. 18A-18B and 19A-19B are sectional views illustrating a method of manufacturing the semiconductor device according to the second embodiment.

Next, above the entire surface, the silicon nitride film 38 of, e.g., a 80 nm-thickness is formed by, e.g., CVD method. Thus, the recesses 22 are filled by the silicon nitride film 38. In the surface of the silicon nitride film 38, recesses 40 are formed, reflecting the configurations of the recesses 22 (FIG. 18A).

Figure 18B:
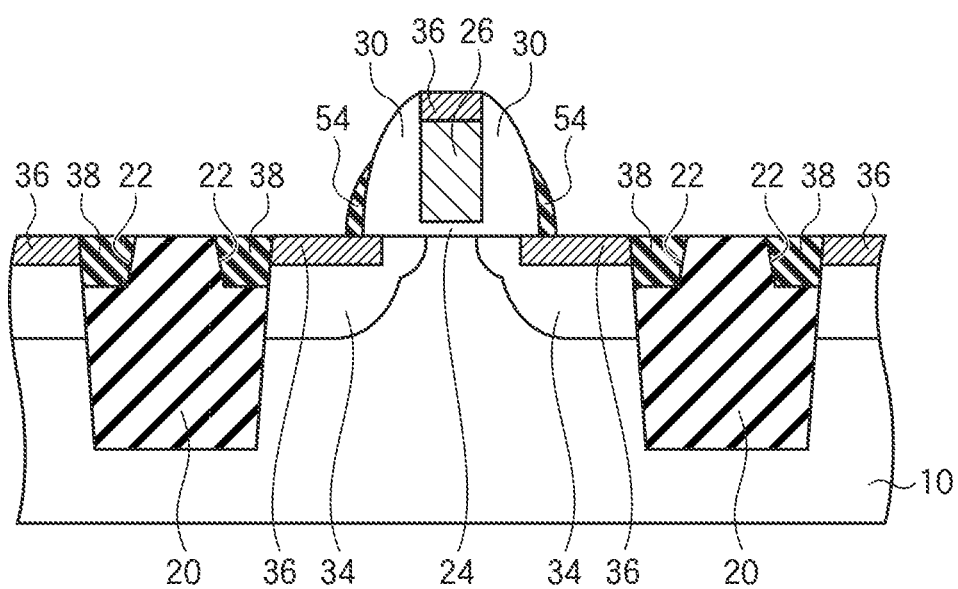

Then, the silicon nitride film 38 is anisotropically etched to leave the silicon nitride film 38 in the recesses 22. The silicon nitride film 38 is etched with, e.g., $CHF_3/Ar/O_2$ mixed gas as the etching gas in an etching quantity equivalent to a film thickness of the film deposited on the plane substrate and an over etch of about 0%-5% of the film thickness. Thus, the silicon nitride film 38 is left in the recesses 22, and the sidewall spacers 54 of the silicon nitride film 38 are left on the side walls of the sidewall spacers 30 (FIG. 18B).

In the manufacturing method according to the present embodiment, for simplifying the manufacturing steps, the silicon nitride film 38 is etched back without the use of the photoresist film 42. The etching conditions are so set that the silicon nitride film 38 is left in the recesses 22, which leaves the sidewall spacers 54 of the silicon nitride film 38 on the side walls of the sidewall spacers 30.

Figure 19A:
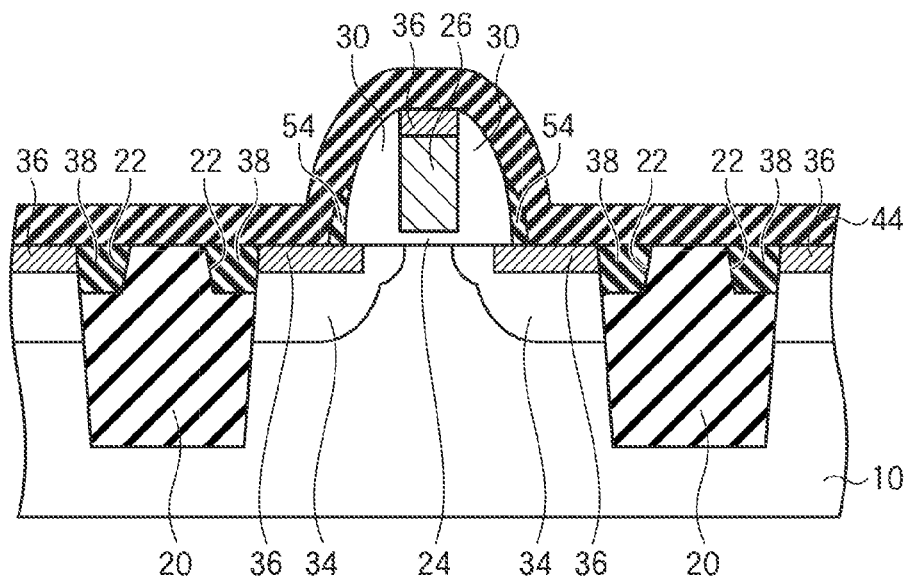

Then, above the entire surface, the silicon nitride film 44 of, e.g., an 80 nm-thickness having a required stress is formed by, e.g., CVD method (FIG. 19A).

Figure 19B:
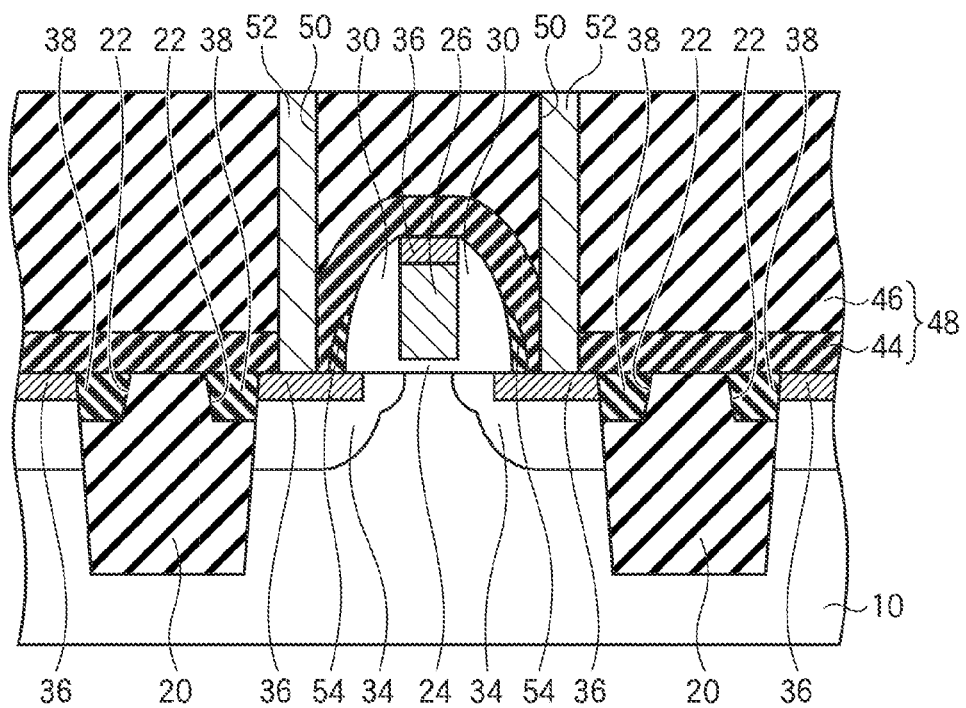

Then, in the same way as in the method of manufacturing the semiconductor device according to the first embodiment illustrated in FIG. 16B, the inter-layer insulating film 48, the contact plugs 52, etc. are formed, and the semiconductor device according to the present embodiment is completed (FIG. 19B).

As described above, according to the present embodiment, the insulating film is buried in the recesses of the device isolation insulating film with respect to the device regions to thereby planarize or mitigate the steps between the surface of the device region and the surface of the device isolation insulating film, the stressor film which applies required lattice stress to the channel region of the MISFET thereon, whereby even when the elements are downsized, the stress from the stressor film can be efficiently applied to the channel region. Thus, the current drive performance of the MISFET can be improved.

The insulating film is buried in the recesses of the borders of the device isolation insulating film with respect to the device regions without the use of photolithography and by the once etching step, whereby the manufacturing steps can be simplified. Thus, the manufacturing cost of the semiconductor device can be decreased.

A Third Embodiment

A semiconductor device and a method of manufacturing the same according to a third embodiment will be described with reference to FIGS. 20 to 23B. The same members of the present embodiment as those of the semiconductor device and method of manufacturing the same according to the first and the second embodiments illustrated in FIGS. 1 to 19B are represented by the same reference numbers not to repeat or to simplify their explanation.

Figure 20:
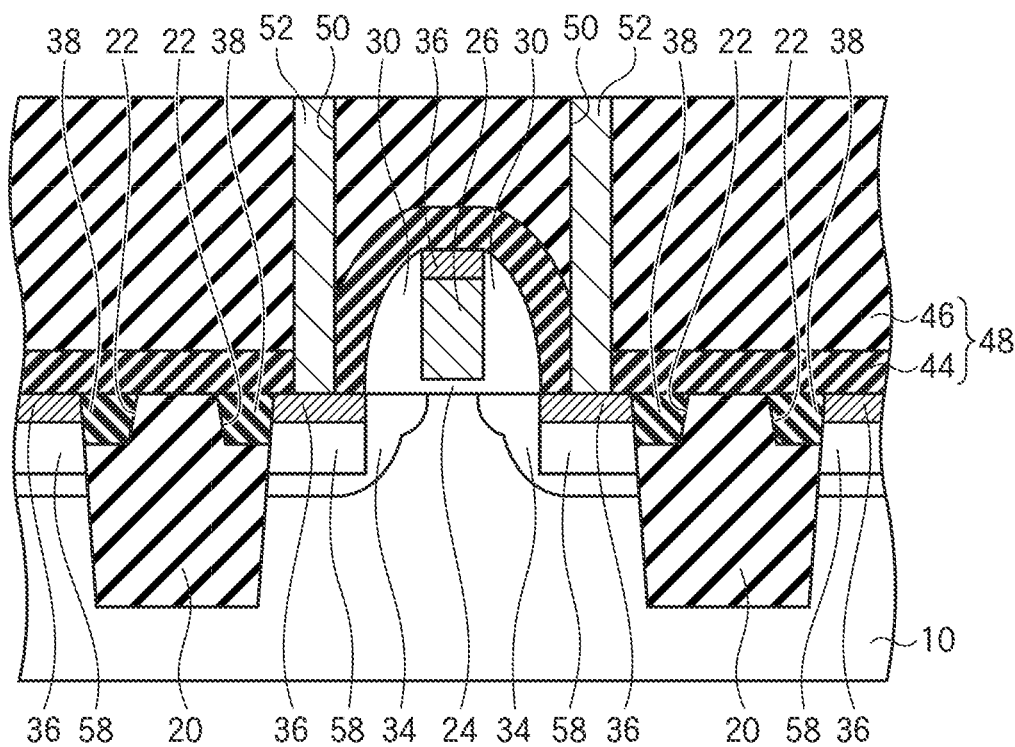
FIG. 20 is a diagrammatic sectional view illustrating a structure of a semiconductor device according to a third embodiment.

FIG. 20 is a diagrammatic sectional view illustrating a structure of the semiconductor device according to the present embodiment. FIGS. 21A-23B are sectional views illustrating the method of manufacturing the semiconductor device according to the present embodiment.

First, the structure of the semiconductor device according to the present embodiment will be described with reference to FIG. 20.

The semiconductor device according to the present embodiment is the same as the semiconductor device according to the first embodiment except that in the former an SiGe layer 58 is buried in the source/drain regions 36 as illustrated in FIG. 20.

The SiGe layer 58 is formed in the source/drain regions 36, whereby the compressive stress from the SiGe layer 58 can be also applied to channel region, and the current drive ability of the p-channel MISFET can be further improved.

Next, the method of manufacturing the semiconductor device according to the present embodiment will be described with reference to FIGS. 21A to 23B.

Figure 21A:
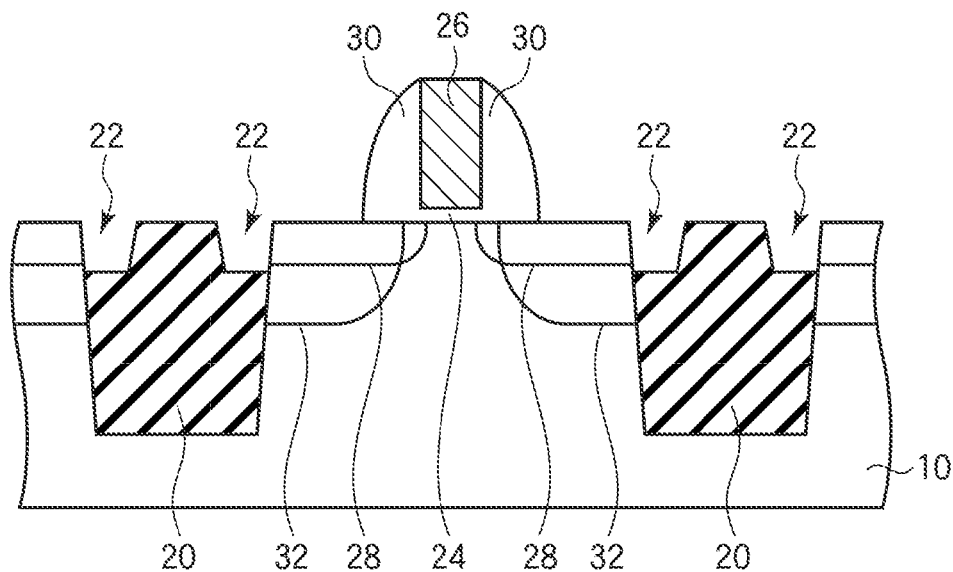
FIGS. 21A-21B, 22A-22B and 23A-23B are sectional views illustrating a method of manufacturing the semiconductor device according to the second embodiment.

First, in the same way as in the method of manufacturing the semiconductor device according to the first embodiment illustrated in FIGS. 11A to 12C, the device isolation insulating film 20 and the MISFET are formed on the silicon substrate 10 (FIG. 21A).

Figure 21B:
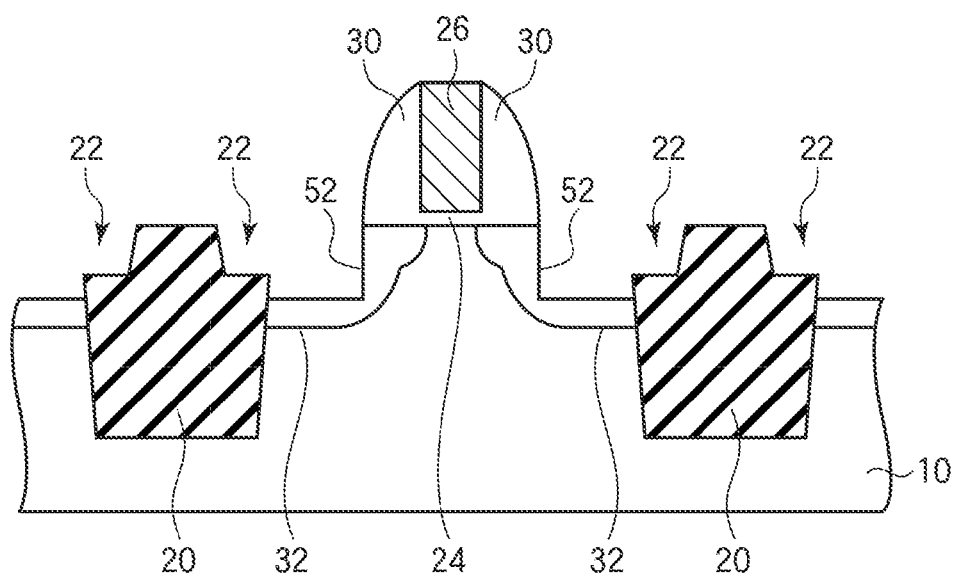

Next, the silicon substrate 10 is etched with the sidewall spacers 20 as the mask to form trenches 56 of, e.g., an 80 nm-depth in the impurity diffused regions 28, 32 (FIG. 21B).

Then, with impurities being added, SiGe is epitaxially grown in the trenches 56 by, e.g., CVD method to form the SiGe layer 58.

Next, thermal processing is made in a nitrogen atmosphere to activate the impurities of the impurity diffused regions 28, 32 to form the source/drain regions 34.

Figure 22A:
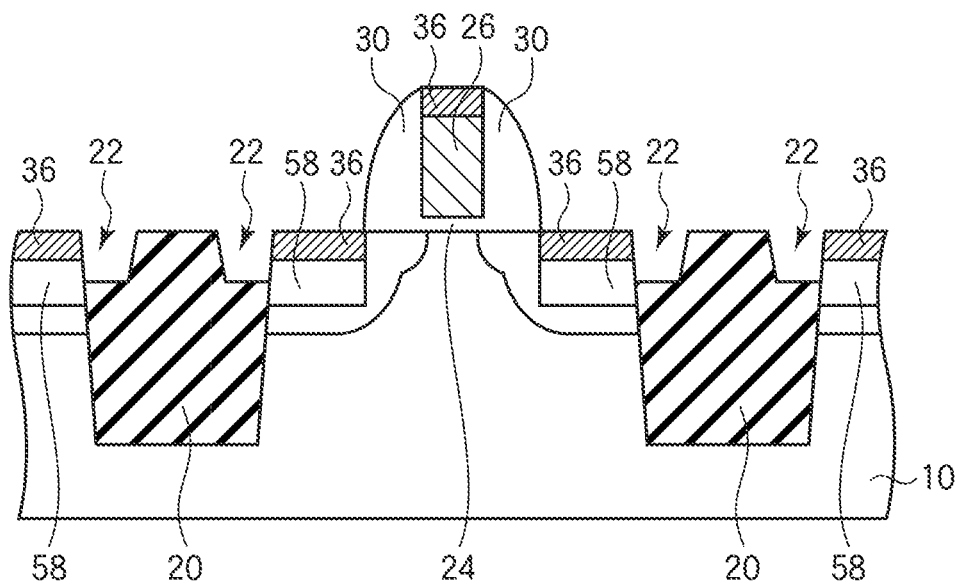

Next, by salicide process, the metal silicide film 36 is formed selectively on the surface sides of the gate electrode 26 and the source/drain regions 34 (FIG. 22A).

Figure 22B:
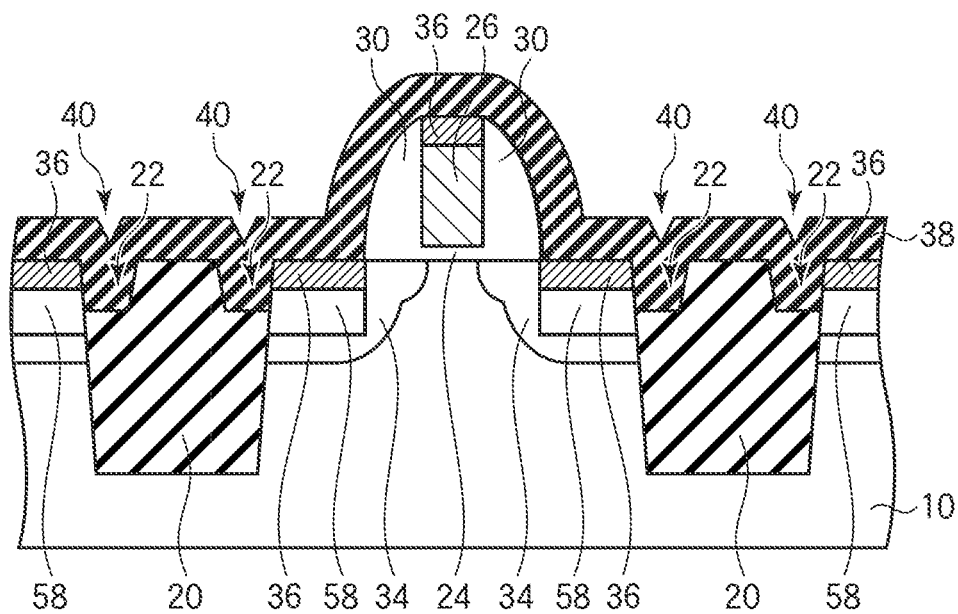

Then, above the entire surface, the silicon nitride film 38 of, e.g., an 80 nm-thickness is formed by, e.g. CVD method. Thus, the recess 22 is filled by the silicon nitride film 38 (FIG. 22B).

Next, in the same way as in the method of manufacturing the semiconductor device according to the first embodiment illustrated in FIGS. 14A to 15B, the silicon nitride film 38 is left selectively in the recess 22. As in the second embodiment, the sidewall spacers 54 as well may be left.

Figure 23A:
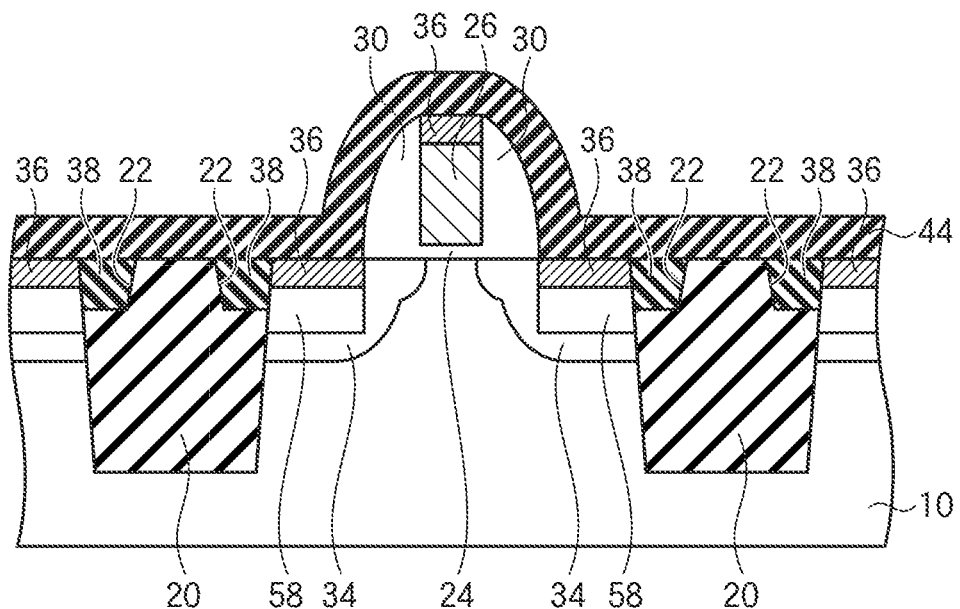

Next, above the entire surface, the silicon nitride film 44 of, e.g., an 80 nm-thickness having a prescribed stress is formed by, e.g., CVD method (FIG. 23A).

Figure 23B:
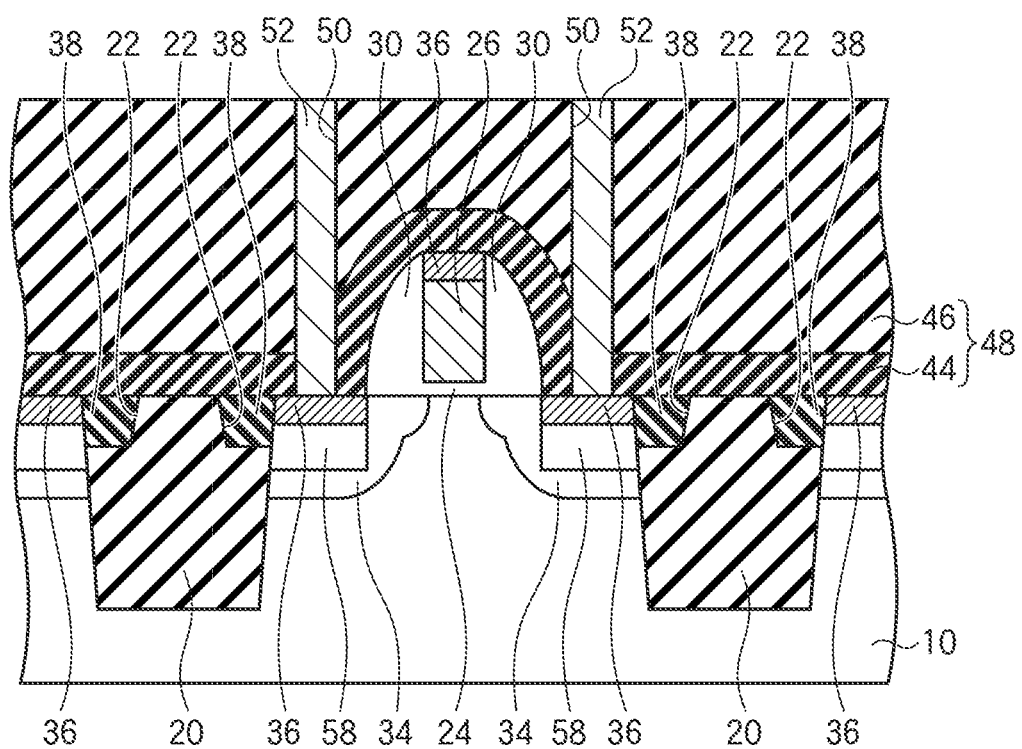

Then, in the same way as in the method of manufacturing the semiconductor device according to the first embodiment illustrated in FIG. 16B, the inter-layer insulating film 48, the contact plugs 52, etc. are formed, and the semiconductor device according to the present embodiment is completed (FIG. 23B).

As described above, according to the present embodiment, the insulating film is buried in the recesses of the device isolation insulating film with respect to the device regions to thereby planarize or mitigate the steps between the surface of the device region and the surface of the device isolation insulating film, the stressor film which applies required lattice stress to the channel region of the MISFET thereon, whereby even when the elements are downsized, the stress from the stressor film can be efficiently applied to the channel region. Thus, the current drive performance of the MISFET can be improved.

The SiGe layer is buried in the source/drain regions, whereby the stress to be applied to the channel region can be further increased, and the current drive performance of the MISFET can be further improved.

A Fourth Embodiment

A semiconductor device and a method of manufacturing the same according to a fourth embodiment will be described with reference to FIGS. 24 to 32. The same members of the present embodiment as those of the semiconductor device and method of manufacturing the same according to the first to the third embodiments illustrated in FIGS. 1 to 23B are represented by the same reference numbers not to repeat or to simplify their explanation.

Figure 24:
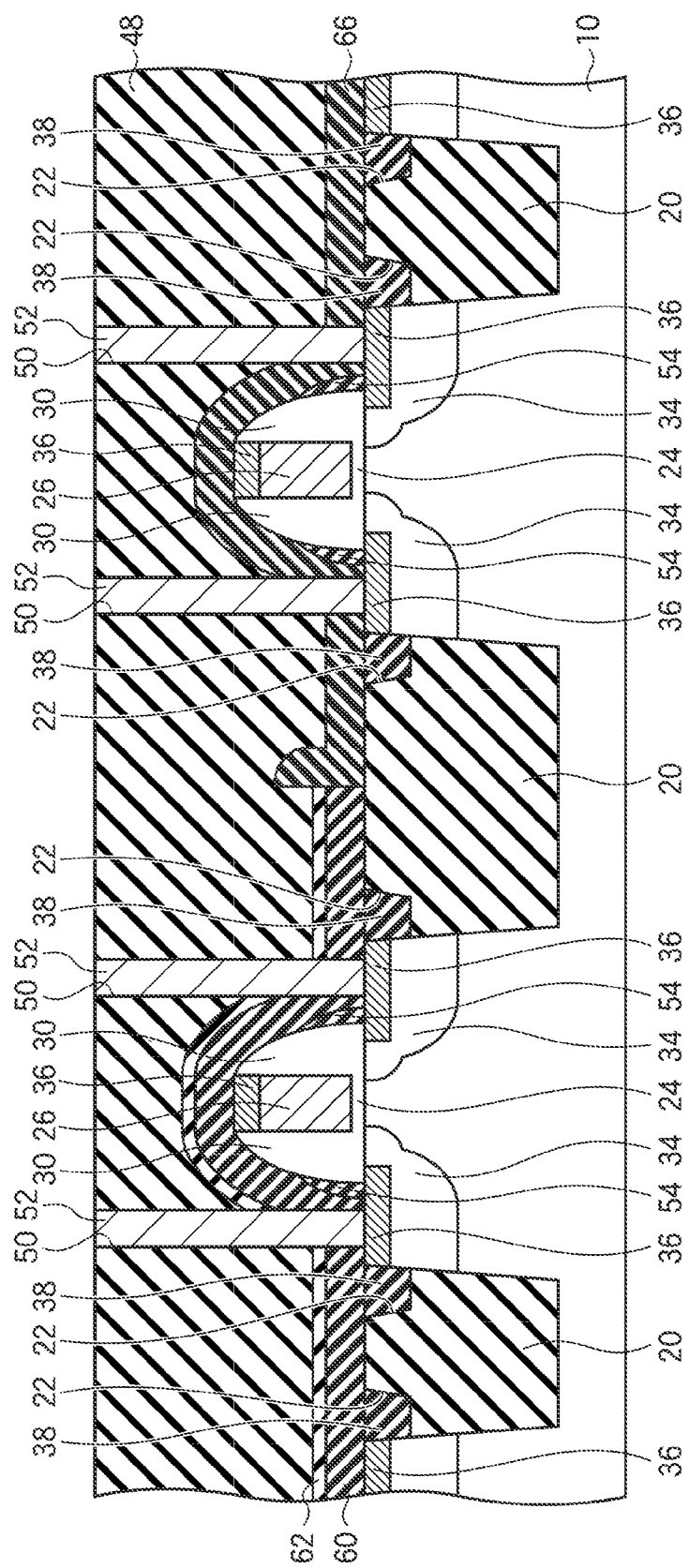
FIG. 24 is a diagrammatic sectional view illustrating a structure of a semiconductor device according to a fourth embodiment.

FIG. 24 is a diagrammatic sectional view illustrating a structure of the semiconductor device according to the present embodiment. FIGS. 25-32 are sectional views illustrating the method of manufacturing the semiconductor device according to the present embodiment.

First, the structure of the semiconductor device according to the present embodiment will be described with reference to FIG. 24.

In the silicon substrate 10, the device isolation insulating film 20 defining the device regions is formed. In the drawings of the present embodiment, the device region on the right side of the central device isolation insulating film 20 is the p-channel MISFET forming region, and the device region on the left side of the central device isolation insulating film 20 is the re-channel MISFET forming region.

In the borders of the device isolation insulating film 20 with respect to the device regions, recesses 22 which are lower than the surface of the silicon substrate 10 of the device regions. The silicon nitride film 38 is buried in the recesses 22 to thereby planarize or mitigate the steps between the surface of the device regions and the surface of the device isolation insulating film 20.

In the n-channel MISFET forming region, re-channel MISFET including the gate electrode 26 formed above the silicon substrate 10 with the gate insulating film 24 formed therebetween, and the source/drain regions 34 formed in the silicon substrate 10 on both sides of the gate electrode 26 are formed. Also in the p-channel MISFET forming region, p-channel MISFET including the gate electrode 26 formed above the silicon substrate 10 with the gate insulating film formed therebetween, and the source/drain regions 34 formed in the silicon substrate 10 on both sides of the gate electrode 26 are formed.

The sidewall spacers 30, 50 are formed on the side walls of the gate electrodes 26 of the n-channel MISFET and the p-channel MISFET. The metal silicide films are formed on the gate electrodes 26 and the source/drain regions 34.

Above the n-channel MISFET, a silicon nitride film 60 having intrinsic tensile stress, and a silicon oxide film 62 are formed. Above the p-channel MISFET, a silicon nitride film 62 having intrinsic compressive stress is formed. Above the silicon oxide film 62 and the silicon nitride 66, the silicon oxide film 46 is formed. Thus, the inter-layer insulating film 48 covering the re-channel MISFET and the p-channel MISFET is formed. In the inter-layer insulating film 48, the contact plugs 52 connected to the metal silicide films 36 are buried.

As described above, according to the present embodiment, the silicon nitride film 38 is formed in the recesses 22 formed in the borders of the device isolation insulating film 20 with respect to the device regions to thereby planarize or mitigate the steps between the surfaces of the device regions and the surface of the device isolation insulating film 20. Above the n-channel MISFET, the silicon nitride film 60 having intrinsic tensile stress is formed. Above the p-channel MISFET, the silicon nitride film 66 having intrinsic compressive stress is formed. The silicon nitride films 60, 66 are formed on the device regions and the device isolation insulating film 20 having the steps in the surfaces planarized or mitigated by the silicon nitride film 38.

Thus, in the semiconductor device according to the present embodiment, tensile stress can be efficiently applied to the channel region of the n-channel MISFET by the silicon nitride film 60, and by the silicon nitride film 66, compressive stress can be efficiently applied to the channel region of the p-channel MISFET. Thus, the current drive performances of both the n-channel MISFET and the p-channel MISFET can be improved.

Next, the method of manufacturing the semiconductor device according to the present embodiment will be described with reference to FIGS. 25 to 32.

Figure 25:
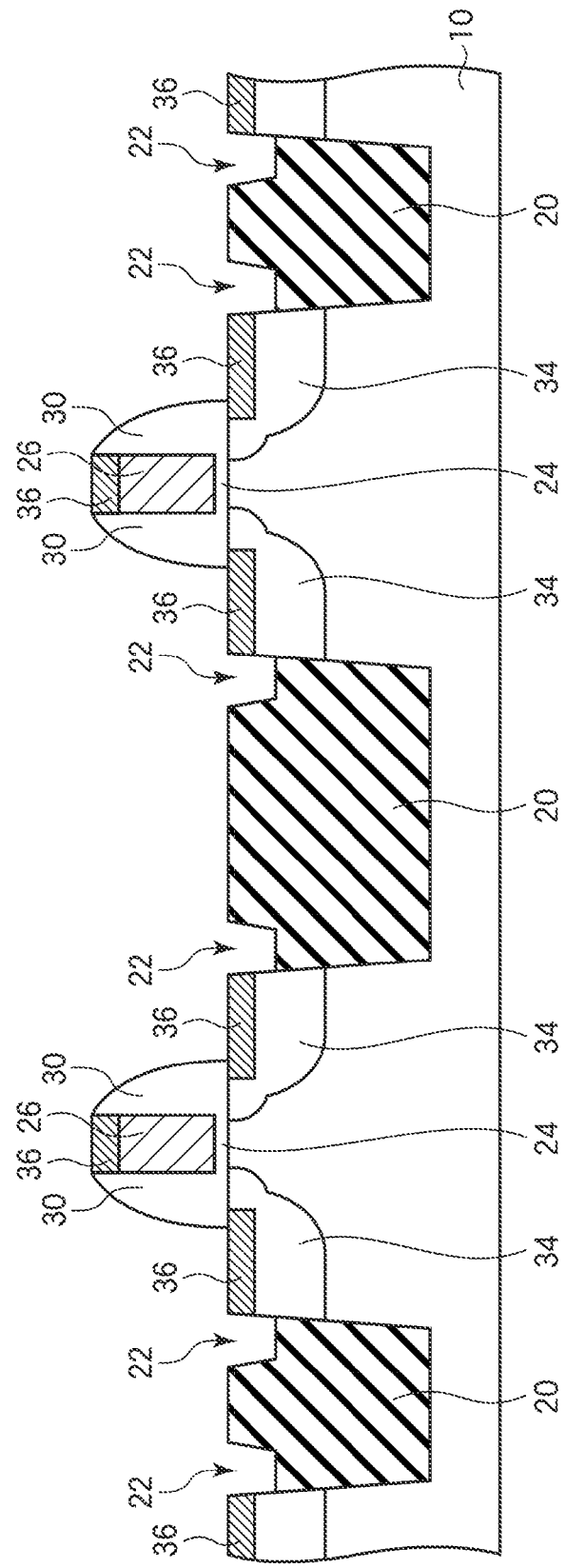
FIGS. 25-32 are sectional views illustrating a method of manufacturing the semiconductor device according to the fourth embodiment.
Figure 26:
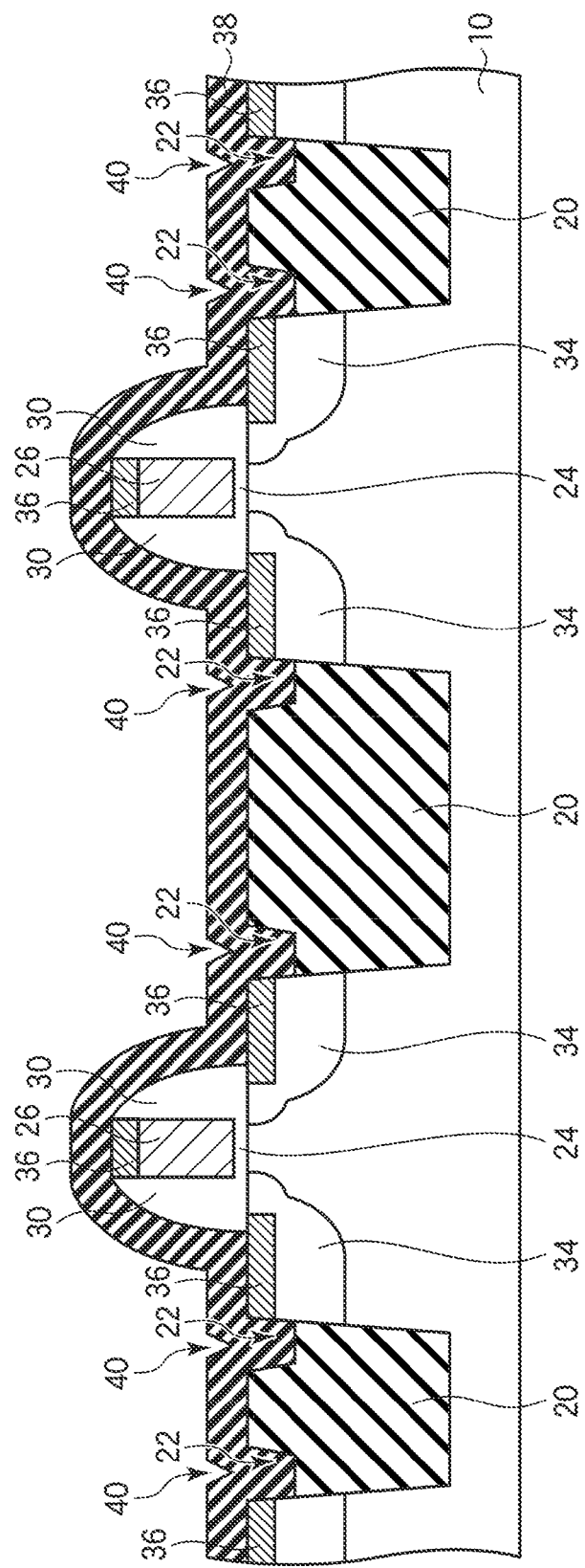

First, in the same way as in the method of manufacturing the semiconductor device according to the first embodiment illustrated in FIG. 11A to FIG. 13A, the device isolation insulating film 20 and the MISFETs are formed on the silicon substrate 10 (FIG. 25). In the drawings, the device region on the right side of the central device isolation insulating film 20 is the p-channel MISFET forming region, and the device region on the left side of the central device isolation insulating film 20 is the n-channel MISFET forming region.

As in the third embodiment, the SiGe layer 58 may be buried in the source/drain regions 34 of the p-channel MISFET.

Next, above the entire surface, the silicon nitride film 38 of e.g., an 80 nm-thickness is deposited by, e.g., CVD method. Thus, the recesses 22 are filled by the silicon nitride film 38. In the surface of the silicon nitride film 38, the recesses 40 are formed, reflecting configurations of the recesses 22.

In the present embodiment, to form the silicon nitride film 38 in both of the p-channel MISFET forming region and the n-channel MISFET forming region, it is preferable that the intrinsic stress of the silicon nitride film 38 is sufficiently small in comparison with the intrinsic stresses of the silicon nitride films 60, 66 to be formed later. The insulating material to be buried in the recesses 22 is not essentially limited to silicon nitride film and can be another insulating material, e.g., silicon oxide film.

Figure 27:
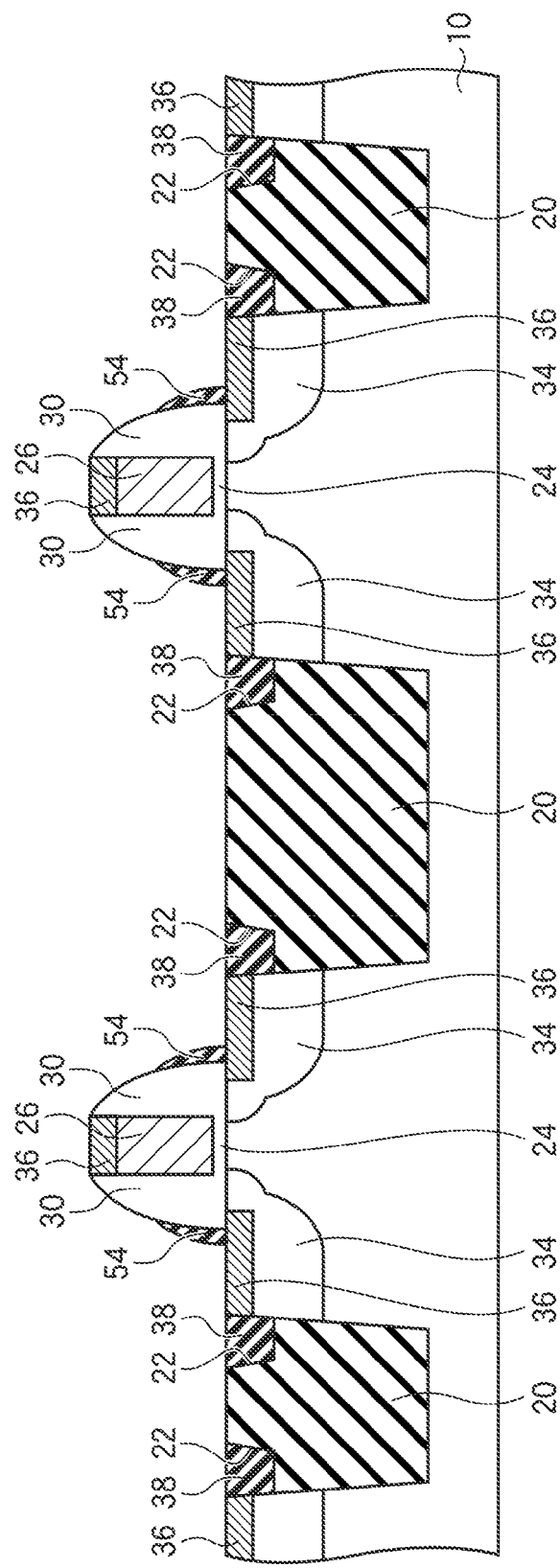

Then, the silicon nitride film 38 is anisotropically etched to leave the silicon nitride film 38 in the recesses 22. The silicon nitride film 38 is etched with, e.g., the mixed gas of $CHF_3/Ar/O_2$ as the etching gas in an etching quantity equivalent to a film thickness of the film deposited on the plane substrate and an over etching of about 0%-5% of the film thickness. Thus, the silicon nitride film 38 is left in the recesses 22 while the sidewall spacers 54 of the silicon nitride film 38 are left on the side walls of the sidewall spacers 30 (FIG. 27).

It is possible that the sidewall spacers 54 are not left by removing in advance the silicon nitride film 38 formed on the sidewall spacers 30 in the same way as in the method of manufacturing the semiconductor device according to the first embodiment.

Figure 28:
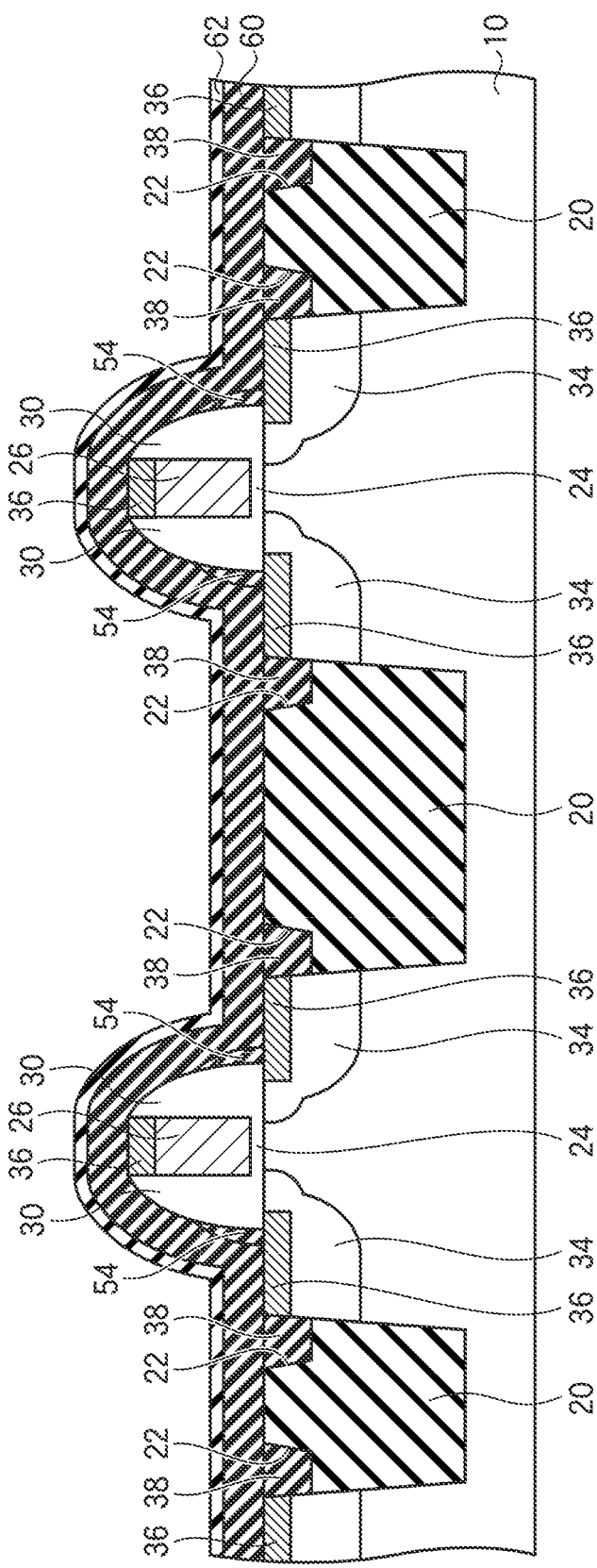

Next, above the entire surface, the silicon nitride film 50 having intrinsic tensile stress of, e.g., an 80 nm-thickness and the silicon oxide film 62 of, e.g., a 10 nm-thickness are formed by, e.g., CVD method (FIG. 28). The silicon nitride film 60 is the stressor film for applying tensile stress to the channel region of the re-channel MISFET.

Next, by photolithography, a photoresist film 64 covering the n-channel MISFET forming region and exposing the p-channel MISFET forming region is formed.

Figure 29:
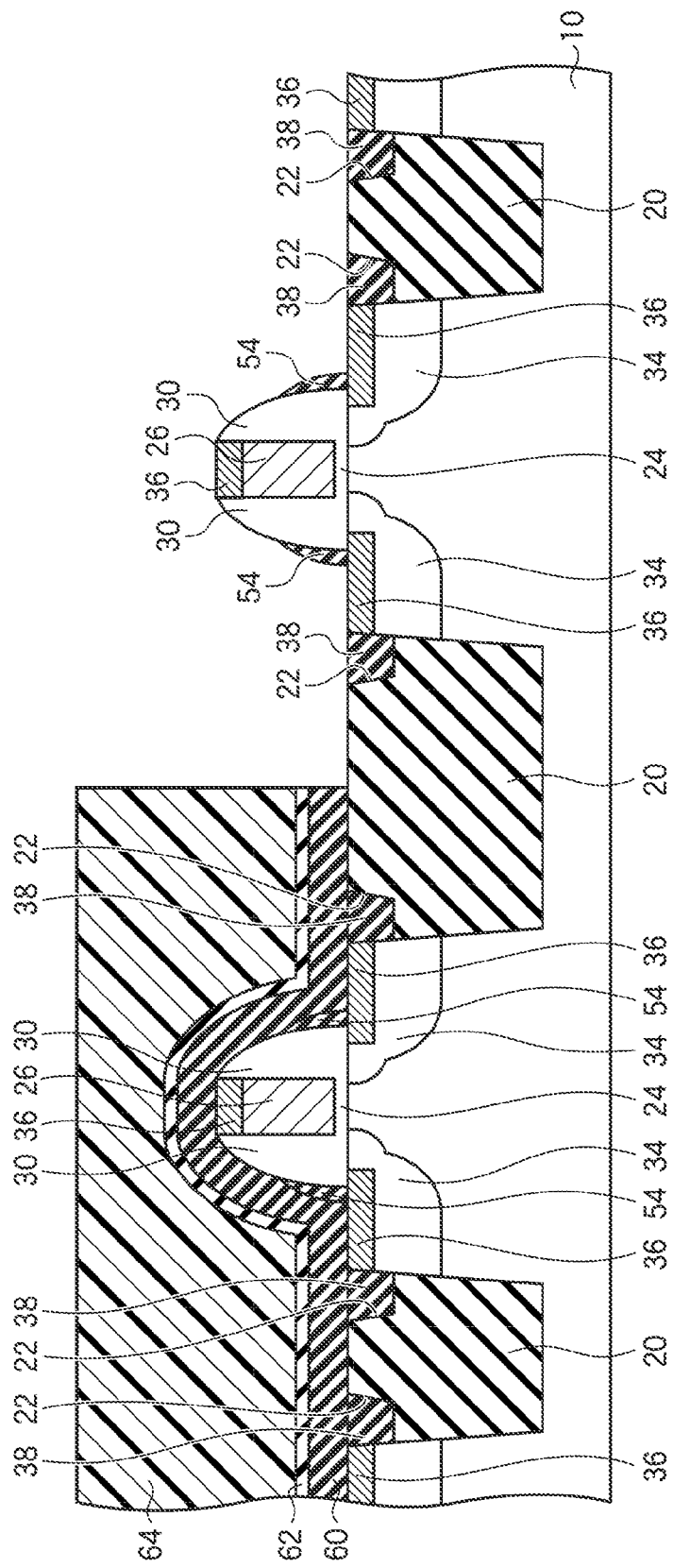

Next, the silicon oxide film 62 and the silicon nitride film 60 are etched with the photoresist film 64 as the mask to remove the silicon oxide film 62 and the silicon nitride film 60 in the p-channel MISFET forming region (FIG. 29).

Next, the photoresist film 64 is removed by, e.g., ashing method.

Figure 30:
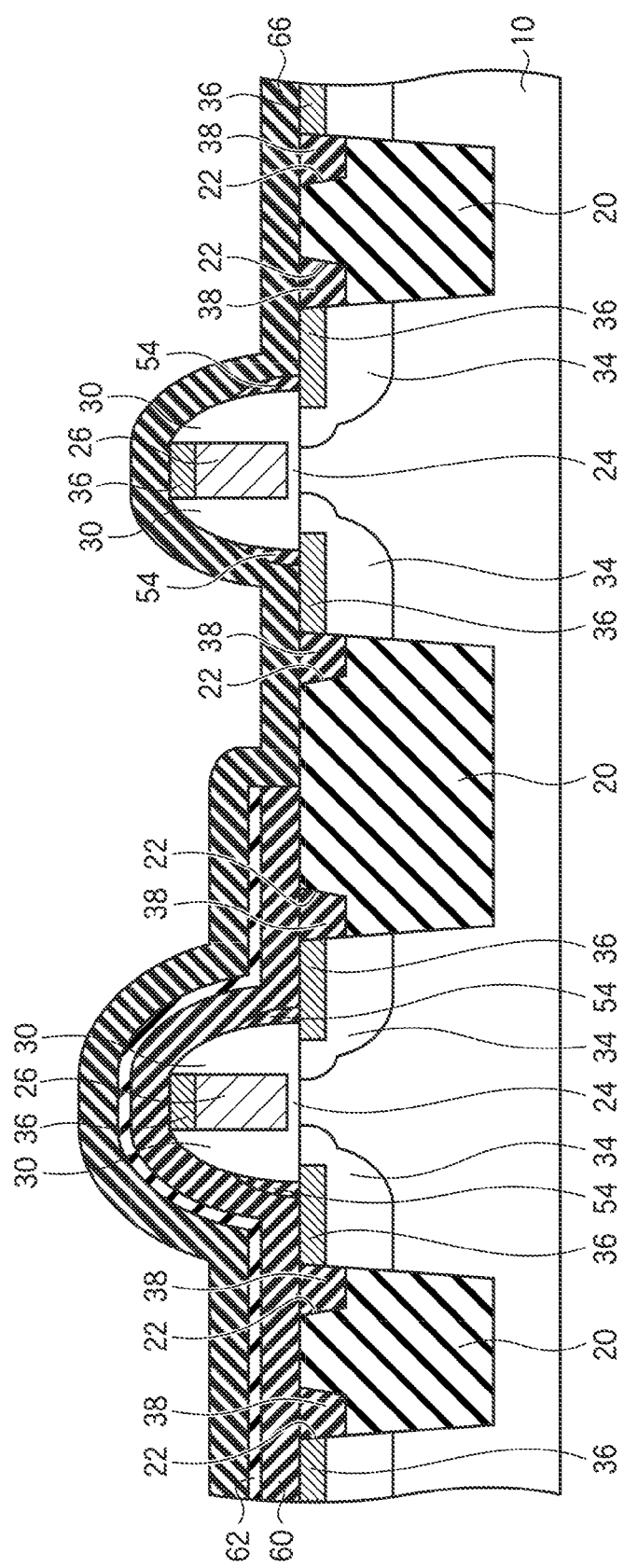

Then, above the entire surface, the silicon nitride film 66 having intrinsic compressive stress of, e.g., an 80 nm-thickness is formed by, e.g., CVD method (FIG. 30). The silicon nitride film 66 is the stressor film for applying compressive stress to the channel region of the p-channel MISFET.

Next, by photolithography, a photoresist film 68 covering the p-channel MISFET forming region and exposing the n-channel MISFET forming region is formed.

Figure 31:
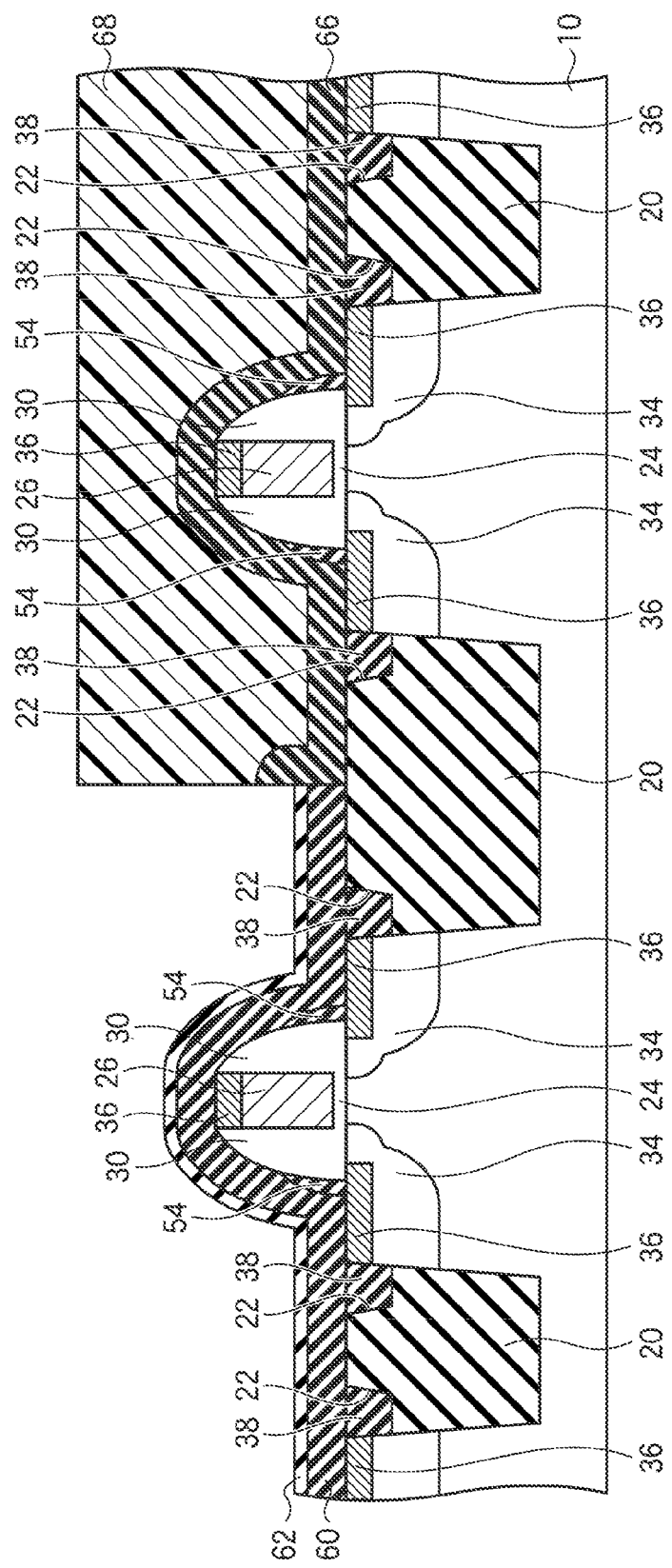

Then, with the photoresist film 68 as the mask and the silicon oxide film 62 as the stopper, the silicon nitride film 66 is patterned to remove the silicon nitride film 66 in the n-channel MISFET forming region (FIG. 31).

Then, the photoresist film 68 is removed by, e.g., ashing method.

Figure 32:
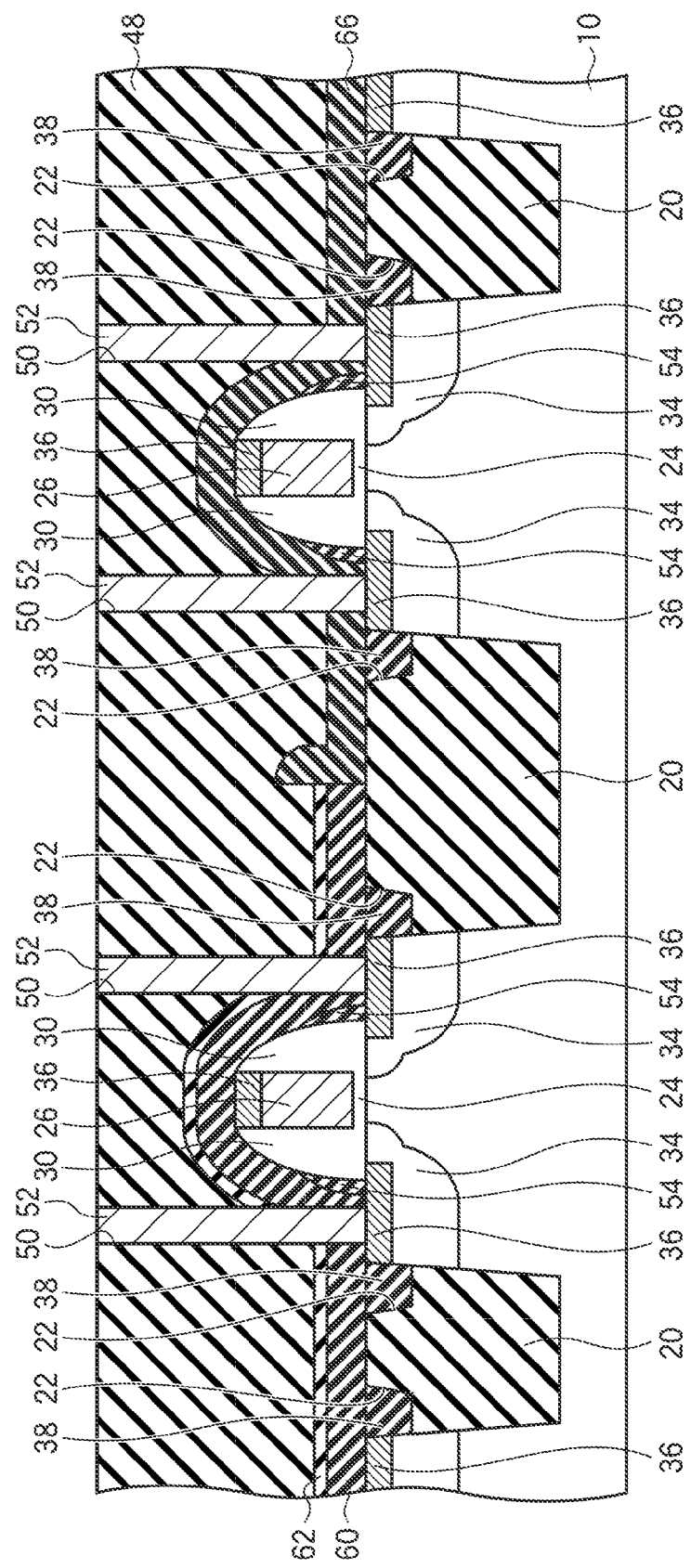

Hereafter, in the same way as in the method of manufacturing the semiconductor device according to the first embodiment illustrated in FIG. 16B, the inter-layer insulating film 48, the contact plugs 52, etc. are formed, and the semiconductor device according to the present embodiment is completed (FIG. 32).

As described above, according to the present embodiment, the insulating film is buried in the recesses of the device isolation insulating film with respect to the device regions to thereby planarize or mitigate the steps between the surface of the device region and the surface of the device isolation insulating film, the stressor film which applies required lattice stress to the channel region of the MISFET thereon, whereby even when the elements are downsized, the stress from the stressor film can be efficiently applied to the channel region. Thus, the current drive performance of the MISFET can be improved.

Different stressor films are formed for the re-channel MISFET and the p-channel MISFET, whereby the current derive performances of both the n-channel MISFET and the p-channel MISFET can be improved.

Modified Embodiments

The above-described embodiments can cover other various modifications.

For example, in the first to the fourth embodiments, the metal silicide films 36 are formed on the gate electrode 26 and on the source/drain regions 34. However, the metal silicide film 36 may not be essentially formed. The metal silicide film 36 may be formed on either of the gate electrode 26 and the source/drain regions 34.

In the above-described embodiment, the silicon nitride film 60 of tensile stress is formed in the re-channel MISFET forming region, and in the p-channel MISFET forming region, the silicon nitride film 66 having compressive stress is formed. However, the silicon nitride film 60 having tensile stress may be formed in both of the n-channel MISFET forming region and the p-channel MISFET forming region.

It is known that when the plane direction of the channel region along the gate length direction is (110) direction, the stressor film having tensile stress is formed in the n-channel MISFET forming region, and in the p-channel MISFET forming region, the stressor film having compressive stress is formed, whereby the characteristics of both the n-channel MISFET and the p-channel MISFET can be improved. On the other hand, when the plane direction of the channel region along the gate length direction is (100) direction, the stressor film having tensile stress is formed in the n-channel MISFET forming region, whereby the characteristics of the n-channel MISFET are improved, but the changes of the characteristics of the p-channel MISFET due to the formation of the stressor film is small.

Accordingly, when the plane direction of the channel region along the gate length direction is (100) direction, it is preferable that different stressor films are not formed in the n-channel MISFET forming region and the p-channel MISFET forming region, and the stressor film of tensile stress is formed above the entire surface.

In the above-described fourth embodiment, the stressor film for the n-channel MISFET is first formed, and later the stressor film for the p-channel MISFET is formed. Either of the stressor films may be formed first.

In the above-described embodiments, as the insulating film buried in the recesses 22, the silicon nitride film 38 whose intrinsic stress is smaller than the intrinsic stress of the silicon nitride films 60, 66 is used. However, films having different stresses may be formed for the n-channel MISFET and the p-channel MISFET, as are the silicon nitride films 60, 66.

The structures, the constituent materials, the manufacturing conditions, etc. described in the above-described embodiments are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising: forming, in a semiconductor substrate, a device isolation insulating film defining a device region, a recess partially formed in an edge of the device isolation insulating film;

forming a gate insulating film above the device region;

forming a gate electrode above the gate insulating film;

forming source/drain regions in the semiconductor substrate;

forming a first insulating film above the semiconductor substrate with the gate electrode and the source/drain regions formed;

etching the first insulating film, leaving the first insulating film in the recess; and forming, above the semiconductor substrate, a second insulating film applying a stress to the semiconductor substrate, after etching the first insulating film, wherein in forming the second insulating film, the second insulating film is formed from a side wall of the gate electrode to an upper surface of the gate electrode, so as to cover the gate electrode.

2. The method of manufacturing a semiconductor device according to claim 1, wherein in etching the first insulating film, the device isolation insulating film is exposed while the first insulating film is left in the recess.

3. The method of manufacturing a semiconductor device according to claim 1, wherein in etching the first insulating film, the first insulating film is so etched that a step between a surface of the device region and the surface of the device isolation insulating film is planarized by the first insulating film.

4. The method of manufacturing a semiconductor device according to claim 1, further comprising:

forming a metal silicide film formed on the source/drain regions after forming the source/drain regions and before forming the first insulating film.

5. The method of manufacturing a semiconductor device according to claim 4, wherein in etching the first insulating film, the first insulating film is so etched that a step between a surface of the metal silicide film and the surface of the device isolation insulating film is planarized by the first insulating film.

6. The method of manufacturing a semiconductor device according to claim 1, wherein the second insulating film is a film having the stress which applies a stress in a direction parallel to a surface of the semiconductor substrate, and the first insulating film is a film having a stress which applies a stress to the semiconductor substrate in the same direction as the second insulating film.

7. The method of manufacturing a semiconductor device according to claim 1, further comprising forming a sidewall spacer on a side wall of the gate electrode after forming the gate electrode and before forming the source/drain regions, wherein etching the first insulating film includes: forming a mask film exposing the sidewall spacer;

etching the first insulating film with the mask film as the mask; and etching the first insulating film after the mask film has been removed.

8. The method of manufacturing a semiconductor device according to claim 1, further comprising:

burying a SiGe film in the source/drain regions after forming the source/drain regions and before forming the first insulating film.

9. The method of manufacturing a semiconductor device according to claim 1, wherein
the device region is a n-channel MISFET forming region, and
the second insulating film is a film having the stress which applies a tensile stress to the semiconductor substrate in a direction parallel to a surface of the semiconductor substrate.

10. The method of manufacturing a semiconductor device according to claim 1, wherein
the device region is a p-channel MISFET forming region, and
the second insulating film is a film having the stress which applies a compressive stress to the semiconductor substrate in a direction parallel to a surface of the semiconductor substrate.

11. The method of manufacturing a semiconductor device according to claim 1, wherein
the second insulating film contacts the device isolation insulating film and the first insulating film.

12. A method of manufacturing a semiconductor device comprising: forming, in a semiconductor substrate, a device isolation insulating film defining a device region, a recess partially formed in an edge of the device isolation insulating film;
forming a gate insulating film above the device region;
forming a gate electrode above the gate insulating film;
forming source/drain regions in the semiconductor substrate;
forming a first insulating film above the semiconductor substrate with the gate electrode and the source/drain regions formed;
etching the first insulating film, leaving the first insulating film in the recess; and
forming, above the semiconductor substrate, a second insulating film applying a stress to the semiconductor substrate, after etching the first insulating film, wherein
the second insulating film contacts the device isolation insulating film and the first insulating film.

13. The method of manufacturing a semiconductor device according to claim 12, wherein
in etching the first insulating film, the first insulating film is so etched that a step between a surface of the device region and the surface of the device isolation insulating film is planarized by the first insulating film.

14. The method of manufacturing a semiconductor device according to claim 12, further comprising:
forming a metal silicide film formed on the source/drain regions after forming the source/drain regions and before forming the first insulating film.

15. The method of manufacturing a semiconductor device according to claim 14, wherein
in etching the first insulating film, the first insulating film is so etched that a step between a surface of the metal silicide film and the surface of the device isolation insulating film is planarized by the first insulating film.

16. The method of manufacturing a semiconductor device according to claim 12, wherein
the second insulating film is a film having the stress which applies a stress in a direction parallel to a surface of the semiconductor substrate, and
the first insulating film is a film having a stress which applies a stress to the semiconductor substrate in the same direction as the second insulating film.

17. The method of manufacturing a semiconductor device according to claim 12, further comprising
forming a sidewall spacer on a side wall of the gate electrode after forming the gate electrode and before forming the source/drain regions, wherein etching the first insulating film includes: forming a mask film exposing the sidewall spacer;
etching the first insulating film with the mask film as the mask; and
etching the first insulating film after the mask film has been removed.

18. The method of manufacturing a semiconductor device according to claim 12, further comprising:
burying a SiGe film in the source/drain regions after forming the source/drain regions and before forming the first insulating film.

19. The method of manufacturing a semiconductor device according to claim 12, wherein
the device region is a n-channel MISFET forming region, and
the second insulating film is a film having the stress which applies a tensile stress to the semiconductor substrate in a direction parallel to a surface of the semiconductor substrate.

20. The method of manufacturing a semiconductor device according to claim 12, wherein
the device region is a p-channel MISFET forming region, and
the second insulating film is a film having the stress which applies a compressive stress to the semiconductor substrate in a direction parallel to a surface of the semiconductor substrate.

* * * * *